United States Patent
Kim et al.

(10) Patent No.: US 8,946,089 B2
(45) Date of Patent: Feb. 3, 2015

(54) METHODS OF FORMING CONTACT HOLES

(71) Applicant: Samsung Electronics Co., Ltd., Suwon-si (KR)

(72) Inventors: Eun-Sung Kim, Seoul (KR); Jae-Woo Nam, Seoul (KR); Chul-Ho Shin, Yongin-si (KR); Shi-Yong Yi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/108,869

(22) Filed: Dec. 17, 2013

(65) Prior Publication Data

US 2014/0193976 A1    Jul. 10, 2014

(30) Foreign Application Priority Data

Jan. 7, 2013   (KR) .................. 10-2013-0001390

(51) Int. Cl.
*H01L 21/311*     (2006.01)
*H01L 21/768*     (2006.01)

(52) U.S. Cl.
CPC .... H01L 21/76802 (2013.01); H01L 21/31144 (2013.01); *Y10S 438/942* (2013.01)
USPC ................ 438/702; 257/E21.258; 430/119.2; 438/689; 438/694; 438/699; 438/706; 438/725; 438/942

(58) Field of Classification Search
USPC ........ 257/E21.258; 430/119.2; 438/689, 694, 438/699, 702, 706, 725, 942
See application file for complete search history.

(56) References Cited

U.S. PATENT DOCUMENTS

| | | | |
|---|---|---|---|
| 7,615,496 B2 | 11/2009 | Lee et al. | |
| 8,084,310 B2 | 12/2011 | Mebarki et al. | |
| 8,114,306 B2 | 2/2012 | Cheng et al. | |
| 8,821,978 B2 * | 9/2014 | Cheng et al. | 427/259 |
| 2008/0176767 A1 * | 7/2008 | Millward | 506/20 |
| 2008/0274413 A1 * | 11/2008 | Millward | 430/5 |
| 2009/0130601 A1 | 5/2009 | Jeon | |
| 2011/0053087 A1 | 3/2011 | Nielsen et al. | |
| 2012/0076978 A1 * | 3/2012 | Millward et al. | 428/120 |
| 2013/0285214 A1 * | 10/2013 | Millward et al. | 257/622 |
| 2014/0060736 A1 * | 3/2014 | Millward et al. | 156/345.3 |
| 2014/0097520 A1 * | 4/2014 | Millward | 257/622 |
| 2014/0107296 A1 * | 4/2014 | Millward et al. | 525/280 |

FOREIGN PATENT DOCUMENTS

| | | |
|---|---|---|
| KR | 10-0596859 B1 | 7/2006 |
| KR | 2007-0071659 A | 7/2007 |
| KR | 2010-0081514 A | 7/2010 |
| KR | 2010-0134418 A | 12/2010 |
| KR | 2011-0001690 A | 1/2011 |
| KR | 10-1064900 B1 | 9/2011 |

\* cited by examiner

*Primary Examiner* — Asok K Sarkar
(74) *Attorney, Agent, or Firm* — Harness, Dickey & Pierce

(57) ABSTRACT

Methods of forming contact holes include forming a first guide pattern over an etching target layer. The first guide pattern has first openings each extending in a first direction and each first opening arranged in a direction perpendicular to the first direction. A first BCP structure is formed in each first opening. The first BCP structure includes first material layers in the first direction at a first pitch in each of the first openings, and second material layers filling a remaining portion of each first opening. First holes are formed by removing the first material layers. A second guide pattern is formed over the first guide pattern and the second material layers, and the above processes are performed on the second guide pattern to form second holes. Portions of the etching target layer overlapped by the first holes or the second holes are removed to form a desired pattern.

20 Claims, 27 Drawing Sheets

1ST DIRECTION ⊗ → 2ND DIRECTION

2ND DIRECTION ⊗ → 1ST DIRECTION

1ST DIRECTION ⊗ → 2ND DIRECTION

2ND DIRECTION ⊗ → 1ST DIRECTION

1ST DIRECTION ⊗   → 2ND DIRECTION

2ND DIRECTION ⊗   → 1ST DIRECTION

METHODS OF FORMING CONTACT HOLES

CROSS-REFERENCE TO RELATED APPLICATION

This application claims priority the benefit of priority under 35 USC §119 to Korean Patent Application No. 10-2013-0001390 filed on Jan. 7, 2013 in the Korean Intellectual Property Office (KIPO), the entire disclosure of which is incorporated herein by reference.

BACKGROUND

1. Field

Example embodiments relate to methods of forming contact holes.

2. Description of the Related Art

Photolithography has been used for forming a pattern of a semiconductor device. However, it is difficult to form a pattern having a minute pitch below 40 nm due to limits in the resolution. Thus, a double patterning method was developed. However, the double patterning method may have too many steps and/or may be complicated.

Thus, a method of forming a minute pitch pattern, particularly, contact holes using a direct self assembly (DSA) has been developed. However, in the DSA method, a material for the DSA may be arranged in a hexagonal shape for a thermodynamic stability such that it may be difficult to form contact holes having a desired arrangement.

SUMMARY

Example embodiments provide methods of forming contact holes having a minute pitch.

According to an example embodiment, a method of forming contact holes includes forming a first guide pattern over an etching target layer. The first guide pattern has a plurality of first openings each extending in a first direction. The first openings are arranged in a second direction substantially perpendicular to the first direction. A first block copolymer (BCP) structure is formed in each of the first openings. The first BCP structure includes a plurality of first material layers arranged in the first direction at a first pitch in each of the first openings, and a plurality of second material layers filling a remaining portion of each of the first openings. First holes are formed by removing the first material layers. A second guide pattern is formed over the first guide pattern and the second material layers. The second guide pattern has a plurality of second openings, and each of the second openings extends in the first direction between the first openings in plan view. A second block copolymer (BCP) structure is formed in each of the second openings. The second BCP structure includes a plurality of third material layers arranged in the first direction at a second pitch in each of the second openings, and a plurality of fourth material layers filling a remaining portion of each of the second openings. Second holes are formed by removing the third material layers. Portions of the etching target layer overlapped by the first holes or the second holes are removed.

In example embodiments, before the first guide pattern is formed over the etching target layer, a neutral layer may be formed over the etching target layer.

In example embodiments, the first openings may be arranged in the second direction at equal distances from each other.

In example embodiments, the first pitch may be about 20 nm to about 50 nm.

In example embodiments, the first material layers may include polymethyl methacrylate (PMMA), and the second material layers may include polystyrene (PS).

In example embodiments, when the first block copolymer (BCP) structure is formed, a first block copolymer (BCP) layer may be formed over the etching target layer and the first guide pattern. The first BCP layer may substantially fill the first openings. The first BCP layer may be annealed. An upper portion of the annealed first BCP layer may be planarized until a top surface of the first guide pattern is exposed.

In example embodiments, when the first holes are formed, the first material layers may be removed by performing a dry etching process or a wet etching process.

In example embodiments, before the second guide pattern is formed, an insulation layer pattern filling the first holes may be formed. A second neutral layer may be formed over the second material layers and the insulation layer pattern.

In example embodiments, the first and second openings may extend in the first direction by substantially the same length as each other, and ends of the first openings may be collinear with ends of the second openings, respectively.

In example embodiments, the first and second openings may have substantially the same size as each other.

In example embodiments, the first and third material layers may have substantially the same material as each other, and the second and fourth material layers may have substantially the same material as each other.

In example embodiments, the first and second pitches may be substantially the same as each other.

In example embodiments, the first and second holes may be collinear with each other in the second direction.

In example embodiments, the first and the second holes may be arranged at a pitch substantially the same as the first and second pitches.

In example embodiments, when the portions of the etching target layer overlapped by the first holes or the second holes are removed, third holes may be formed by etching portions of the first guide pattern exposed by the second holes. Portions of the etching target layer exposed by the first holes or the third holes may be removed.

According to example embodiments, the contact holes having a minute pitch about 20 to 50 nm may be obtained with a desired arrangement.

According to another example embodiment, a method of forming contact holes includes forming first guide patterns over a target layer, the first guide patterns having a plurality of first openings and extending in a first direction. First block copolymer (BCP) structure patterns are formed between the first guide patterns by, providing first-type direct self-assembly polymer material layers each between second-type direct self-assembly polymer material layers. The first-type direct self-assembly polymer material layers are arranged at a first pitch in the first direction. First holes are formed by removing the first-type direct self-assembly polymer material layers. Second guide patterns are formed over remaining portions of the first block copolymer (BCP) structure patterns, the second guide patterns extending in the first direction and having a plurality of second openings over the first guide patterns. Second block copolymer (BCP) structure patterns are formed between the second guide patterns by, providing third-type direct self-assembly polymer material layers each between fourth-type direct self-assembly polymer material layers. The third-type direct self-assembly polymer material layers are arranged at a second pitch in the first direction. Second holes are formed by removing the third-type direct self-assembly polymer material layers. Portions of the target layer overlapped by at least one of the first holes and the second holes are etched to form the contact holes.

The etching portions of the target layer may result in the contact holes each having a shape other than a hexagonal shape.

The forming first BCP structure patterns may include substantially filling the first openings between the first guide patterns, and the forming second BCP structure patterns may include substantially filling the second openings between the second guide patterns.

The forming second guide patterns may include forming the second openings between the second guide patterns collinear with the first openings between the first guide patterns in a second direction. The second direction may be substantially perpendicular to the first direction.

The first-type and third-type direct self-assembly polymer material layers may be formed of a polymer selected from polymethyl methacrylate (PMMA) and polystyrene (PS). The first-type direct self-assembly polymer material layers may be formed of a different polymer than the second-type direct self-assembly polymer material layers, and the third-type direct self-assembly polymer material layers may be formed of a different polymer than the fourth-type direct self-assembly polymer material layers.

BRIEF DESCRIPTION OF THE DRAWINGS

Example embodiments will be more clearly understood from the following detailed description taken in conjunction with the accompanying drawings.

FIGS. 1, 3, 5, 7, 9, 11, 13, 15, 17, 19, 21 and 23 are cross-sectional views illustrating stages of a method of forming contact holes in accordance with example embodiments;

FIG. 52 is a perspective view illustrating a phase change memory device manufactured by using the method thereof.

DETAILED DESCRIPTION OF EXAMPLE EMBODIMENTS

Figure 1:
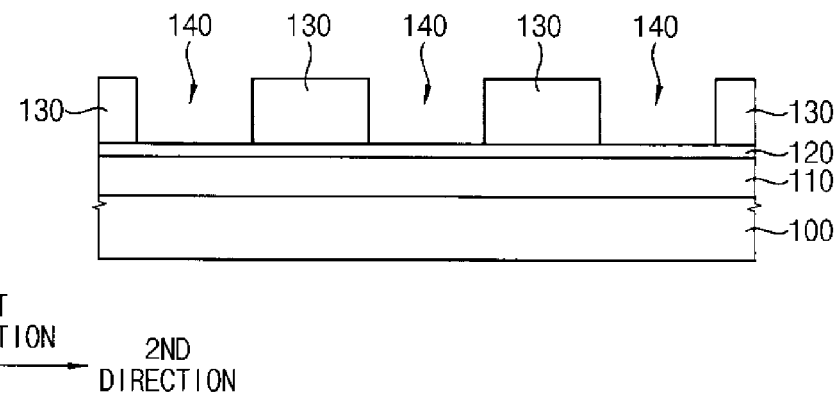
FIGS. 1 to 52 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term us elements, these elements should not be limited by these terms. It will be understood that, if an element is referred to as being "on," "connected to" or "coupled to" another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., or the purpose of describing particular embodiments only and is not intended to be limiting of examples to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Figure 25:
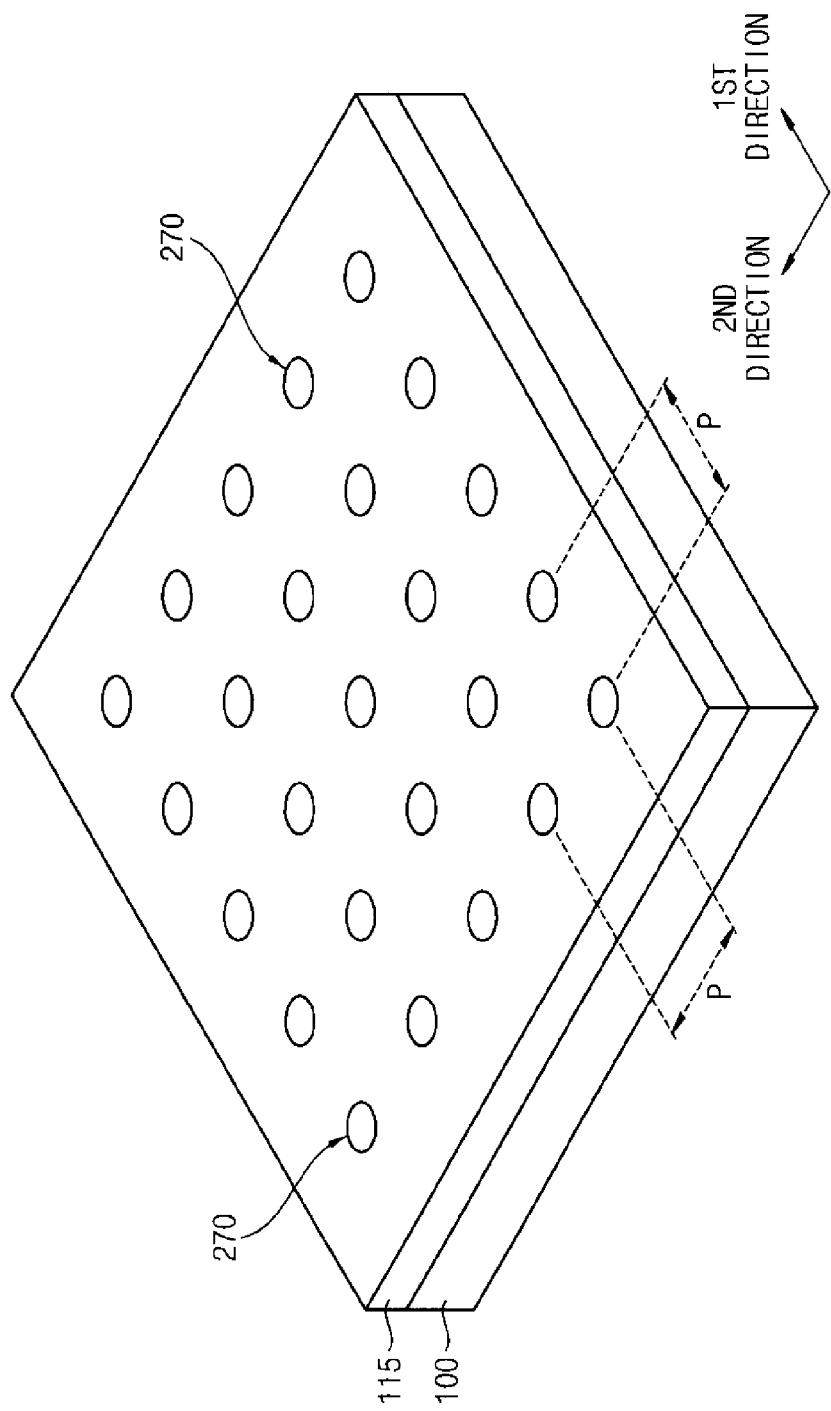
FIG. 25 is a perspective view illustrating the contact holes formed by the above method.

FIGS. 1, 3, 5, 7, 9, 11, 13, 15, 17, 19, 21 and 23 are cross-sectional views illustrating stages of a method of forming contact holes in accordance with example embodiments, FIGS. 2, 4, 6, 8, 10, 12, 14, 16, 18, 20, 22 and 24 are plan views illustrating the method of forming the contact holes, and FIG. 25 is a perspective view illustrating the contact holes formed by the above method. Particularly, FIGS. 1, 3, 5, 7, 9, 11, 13, 15, 17, 19, 21 and 23 are cross-sectional views cut along a line I-I' in FIGS. 2, 4, 6, 8, 10, 12, 14, 16, 18, 20, 22 and 24, respectively.

Figure 2:
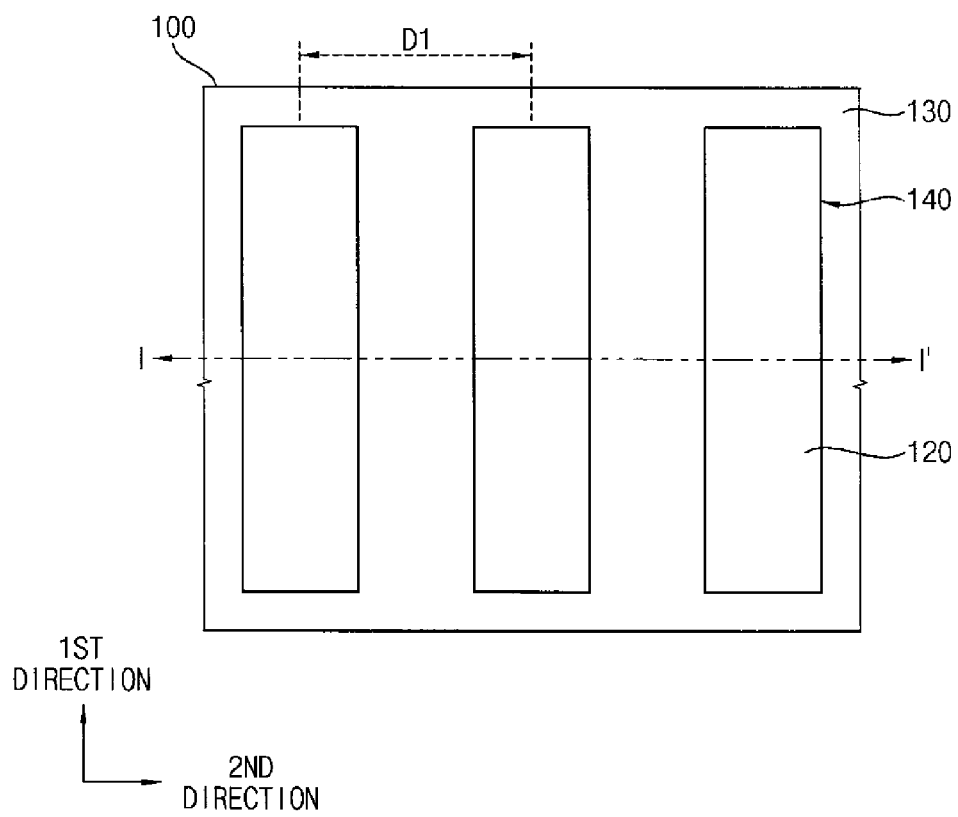
FIGS. 2, 4, 6, 8, 10, 12, 14, 16, 18, 20, 22 and 24 are plan views illustrating the above method of forming the contact holes.

Referring to FIGS. 1 and 2, after forming sequentially an etching target layer 110 and a first neutral layer 120 on a substrate 100, a first guide pattern 130 may be formed on the first neutral layer 120.

The substrate 100 may be a semiconductor substrate including a semiconductor material, e.g., silicon, germanium, etc., a silicon-on-insulator (SOI) substrate, a germanium-on-insulator (GOI) substrate, or an insulation substrate including an insulating material.

The etching target layer 110 may be a layer a portion of which may be etched to form contact holes, and the etching target layer 110 may be a conductive layer including doped polysilicon, a metal, a metal nitride, a metal silicide, etc., or an insulation layer including an oxide, a nitride, etc.

The first neutral layer 120, for example, may include polystyrene-r-polymethyl methacrylate (PS-r-PMMA), and a mass ratio of the PS in the PS-r-PMMA may be about 61%. The PS and the PMMA in the PS-r-PMMA may be arranged randomly, and thus the etching target layer 110 therebeneath may be neutralized.

The first guide pattern 130 may have a plurality of first openings 140 arranged in a second direction, each of which may extend in a first direction substantially perpendicular to the second direction. Thus, portions of the first neutral layer 120 therebeneath may be exposed.

In example embodiments, the first openings 140 may be arranged in the second direction at regular distances. In example embodiments, the first openings 140 may be arranged in the second direction at about an 80 nm pitch. That is, a first distance D1 between centers of the first openings 140 in the second direction may be about 80 nm. Also, the first openings 140 may be extended in a first direction by substantially the same length as each other, and when viewed in the second direction, both ends of each of the first openings 140 may be overlapped.

In example embodiments, the first guide pattern 130 may be a photoresist pattern.

Figure 3:
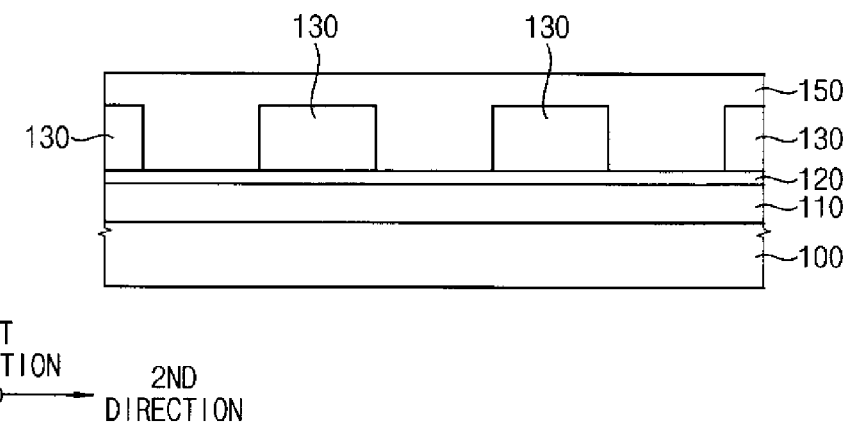
Figure 4:
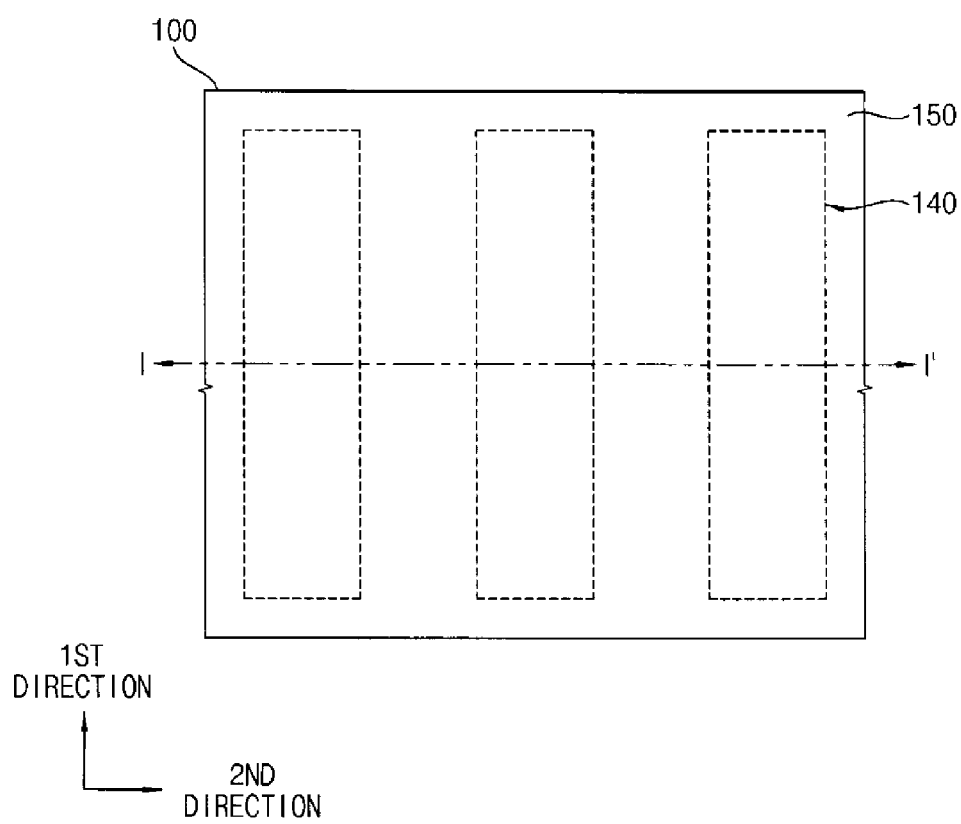

Referring to FIGS. 3 and 4, a first block copolymer (BCP) layer 150 sufficiently filling the first openings 140 may be formed on the first guide pattern 130 and the first neutral layer 120.

The first BCP layer 150 may include a material of a direct self assembly (DSA). That is, the first BCP layer 150 may include a material in which PS and PMMA are mixed properly. In example embodiments, the first BCP layer 150 may be a PS-b-PMMA including the PS and the PMMA with a mass ratio of about 7:3.

In example embodiments, the first BCP layer 150 may be formed on the first guide pattern 130 and the first neutral layer 120 by a spin coating process.

Figure 5:
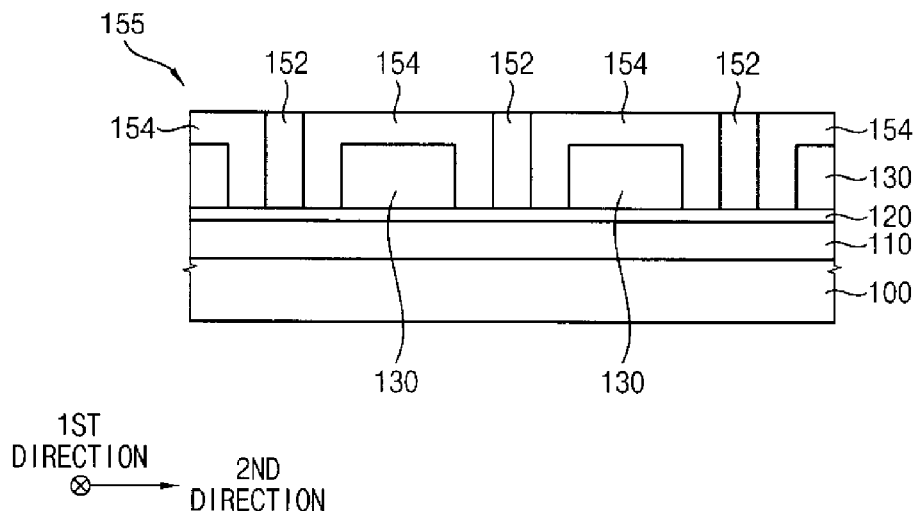
Figure 6:
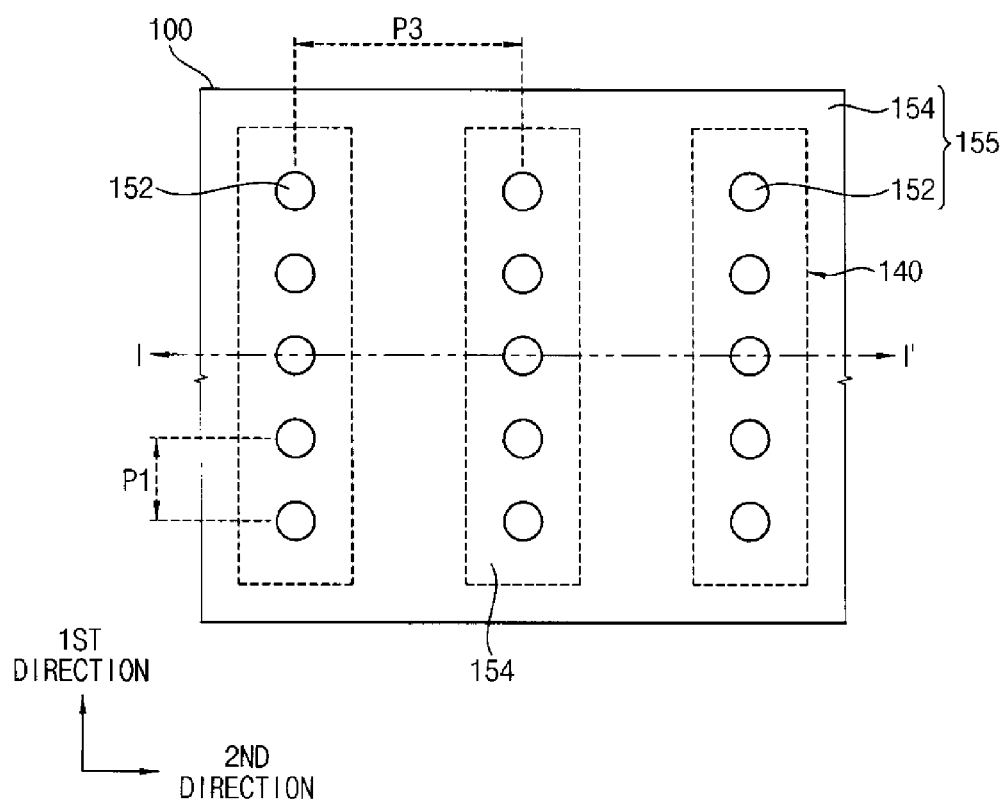

Referring to FIGS. 5 and 6, the first BCP layer 150 may be annealed to form a first block copolymer (BCP) structure 155.

In example embodiments, the first BCP layer 150 may be annealed at a temperature of about 180° C. for about 6 hours to form the first BCP structure 155.

The first BCP structure 155 may include a plurality of first material layers 152 arranged in the first direction at a first pitch P1 in the first openings 140, respectively, and a second material layer 154 filling remaining portions of the first openings 140. Each first material layer 152 may be formed in a cylindrical or pillar shape at a central portion of each first opening 140, and the second material layer 154 may surround sidewalls of the first material layers 152 and may cover a sidewall and a top surface of the first guide pattern 130. In example embodiments, the first material layers 152 may include PMMA, and the second material layer 154 may include PS.

In example embodiments, the first openings 140 may be extended in the first direction by substantially the same length as each other, and when viewed in the second direction, both ends thereof may be overlapped. Thus, the first material layers 152 self-assembled in the first openings 140 may be arranged in the second direction collinearly. The first material layers 152 in the first openings 140 adjacent to each other may be arranged in the second direction at a third pitch P3.

In example embodiments, the first pitch P1 may be about 20 nm to about 50 nm, and the third pitch P3 may be about twice as long as the first pitch P1.

Figure 7:
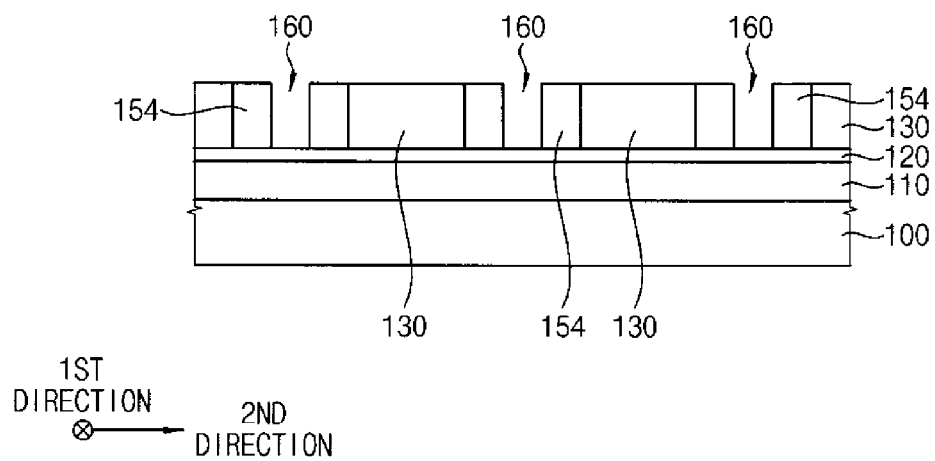
Figure 8:
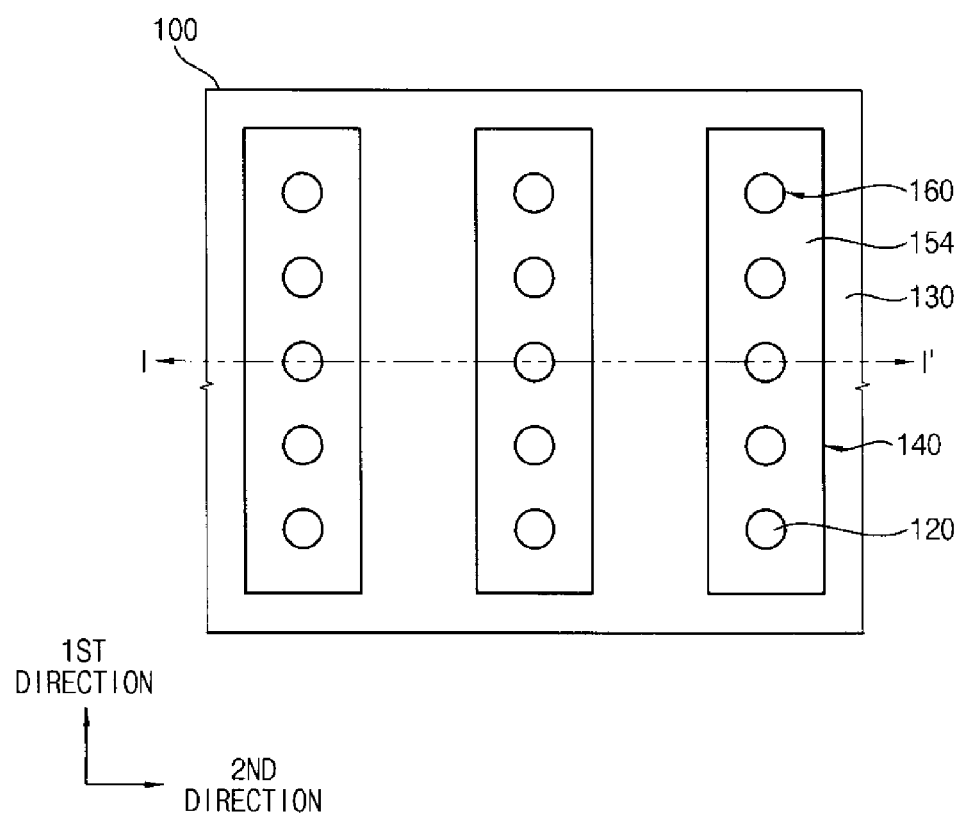

Referring to FIGS. 7 and 8, an upper portion of the first BCP structure 155 may be planarized until a top surface of the first guide pattern 130 may be exposed. Thus, the first BCP structure 155 may be formed only in the first openings 140. That is, the first material layers 152 arranged in the first direction and the second material layer 154 filling remaining portions of the first openings 140 may be formed.

Alternatively, before the annealing process illustrated with reference to FIGS. 5 and 6, the planarization process may be performed first, and then the annealing process may be performed.

The first material layers 152 may be removed to form first holes 160 exposing the first neutral layer 120.

In one example embodiment, the first material layers 152 may be removed by a wet etching process using acetic acid and deionized water. In another example embodiment, the first material layers 152 may be removed by a dry etching process, e.g., by a reactive ion etching (RIE) process using oxygen ion.

Figure 9:
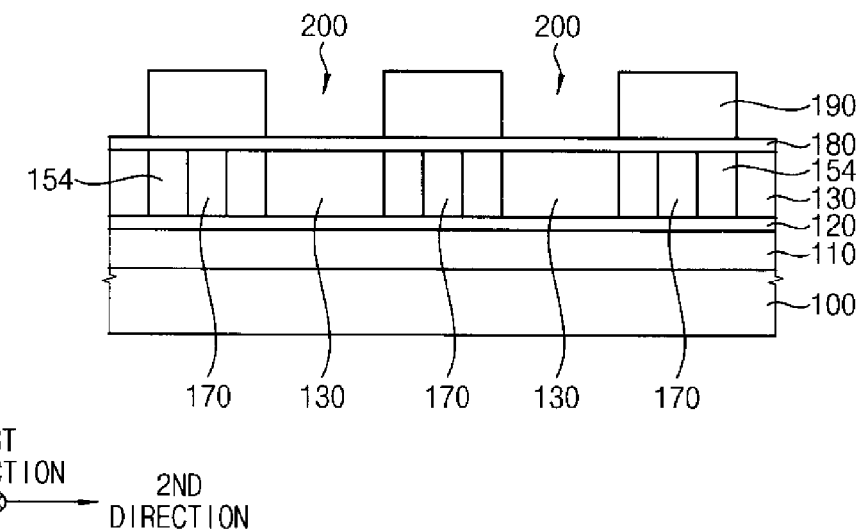
Figure 10:
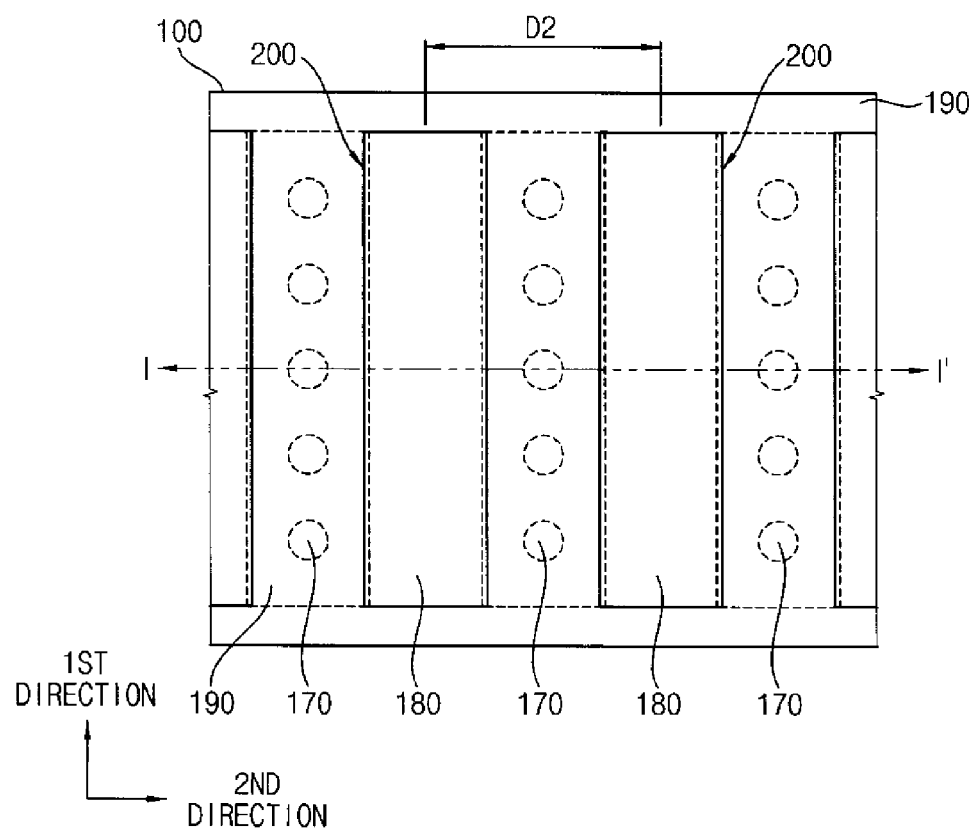

Referring to FIGS. 9 and 10, after forming an insulation layer pattern 170 filling the first holes 160, a second neutral layer 180 may be formed on the first guide pattern 130, the second material layers 154 and the insulation layer pattern 170.

The insulation layer pattern 170, for example, may be formed to include silicon oxide. In example embodiments, an insulation layer filling sufficiently the first holes 160 may be formed on the first neutral layer 120, the second material layers 154 and the first guide pattern 130 by a chemical vapor deposition (CVD) process or an atomic layer deposition (ALD) process, and the insulation layer may be planarized until top surfaces of the second material layers 154 and the first guide pattern 130 may be exposed to form the insulation layer pattern 170.

The second neutral layer 180, for example, may include PS-r-PMMA, and a mass ratio of the PS in the PS-r-PMMA may be about 61%. That is, the second neutral layer 180 may include a material substantially the same as that of the first neutral layer 120.

A second guide pattern 190 may be formed on the second neutral layer 180. The second guide pattern 190 may have a plurality of second openings 200 arranged in the second direction, each of which may be extended in the first direction. Thus, portions of the second neutral layer 180 thereBeneath may be exposed.

In example embodiments, the second openings 200 may be arranged in the second direction at regular distances. In one example embodiment, the second openings 200 may be arranged in the second direction at about an 80 nm pitch. That is, a second distance D2 between centers of the second openings 200 in the second direction may be about 80 nm, which may be substantially the same as the first distance D1. Also, the second openings 200 may be extended in the first direction by substantially the same length as each other, and when viewed in the second direction, both ends thereof may be overlapped.

In example embodiments, the second openings 200 may be extended in the first direction by substantially the same length as the first openings 140, and both ends of the second openings 200 may be collinear with those of the first openings 140, respectively, in a plan view. In one example embodiment, the first openings 140 and the second openings 200 may have substantially the same size.

In example embodiments, the second guide pattern 190 may be a photoresist pattern. That is, the second guide pattern 190 may include a material substantially the same as that of the first guide pattern 130.

Figure 11:
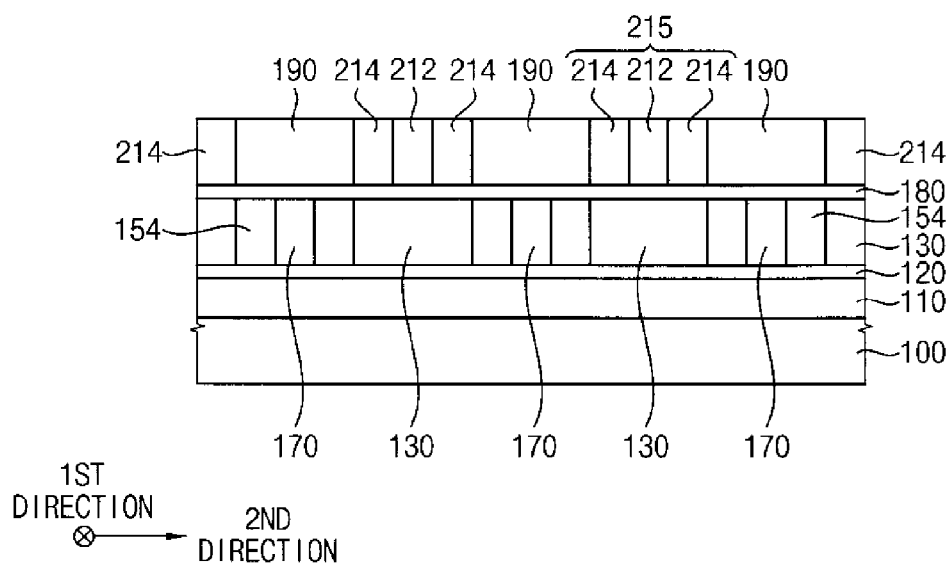
Figure 12:
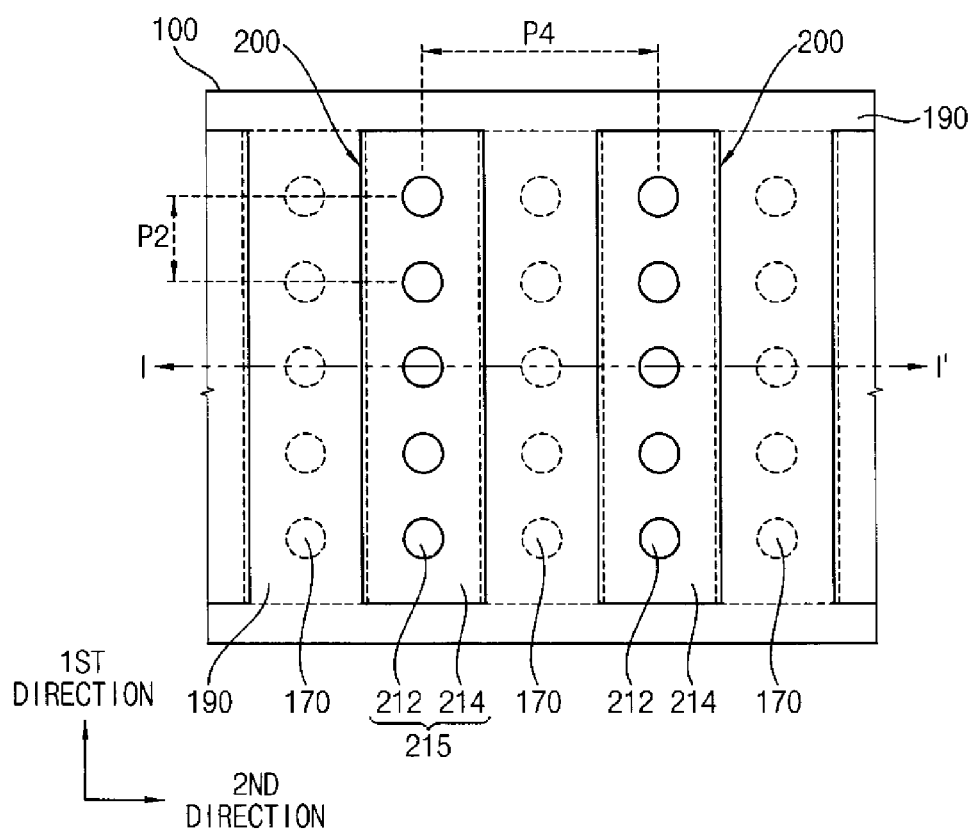

Referring to FIGS. 11 and 12, after performing processes substantially the same as or similar to those illustrated with reference to FIGS. 3 to 6, a planarization process substantially the same as or similar to that illustrated with reference to FIGS. 7 and 8 may be performed.

Thus, a second block copolymer (BCP) structure including a plurality of third material layers 212 arranged in the first direction at a second pitch P2 in the second openings 200, respectively, and a fourth material layer 214 filling remaining portions of the second openings 200 may be formed. Each third material layer 212 may be formed in a cylindrical or pillar shape at a central portion of each second opening 200, and the fourth material layer 214 may surround sidewalls of the third material layers 212 and may cover a sidewall of the second guide pattern 190. In one example embodiment, the third material layers 212 may include PMMA, and the fourth material layer 214 may include PS. That is, the third material layers 212 may include a material substantially the same as that of the first material layers 152, and the fourth material layer 214 may include a material substantially the same as that of the second material layer 154.

In one example embodiment, the second openings 200 may be extended in the first direction by substantially the same length as each other, and when viewed in the second direction, both ends thereof may be overlapped. Thus, the third material layers 212 self-assembled in the second openings 200 may be arranged in the second direction collinearly. The third material layers 212 in the second openings 200 adjacent to each other may be arranged in the second direction at a fourth pitch P4.

In example embodiments, the second pitch P2 may be about 20 to about 50 nm, and the fourth pitch P4 may be about twice as long as the second pitch P2. That is, the second pitch P2 may be substantially the same as the first pitch P1, and the fourth pitch P4 may be substantially the same as the third pitch P3.

Figure 13:
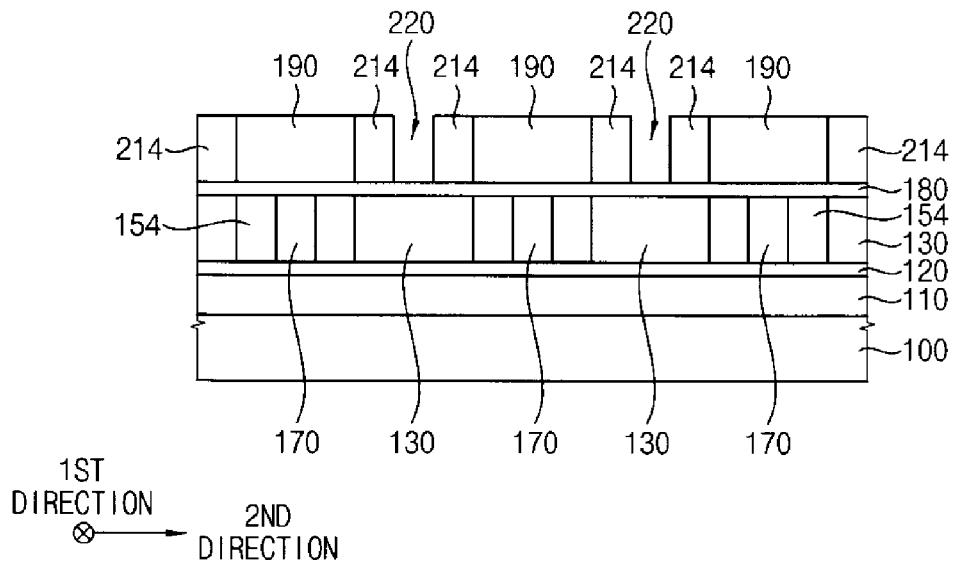
Figure 14:
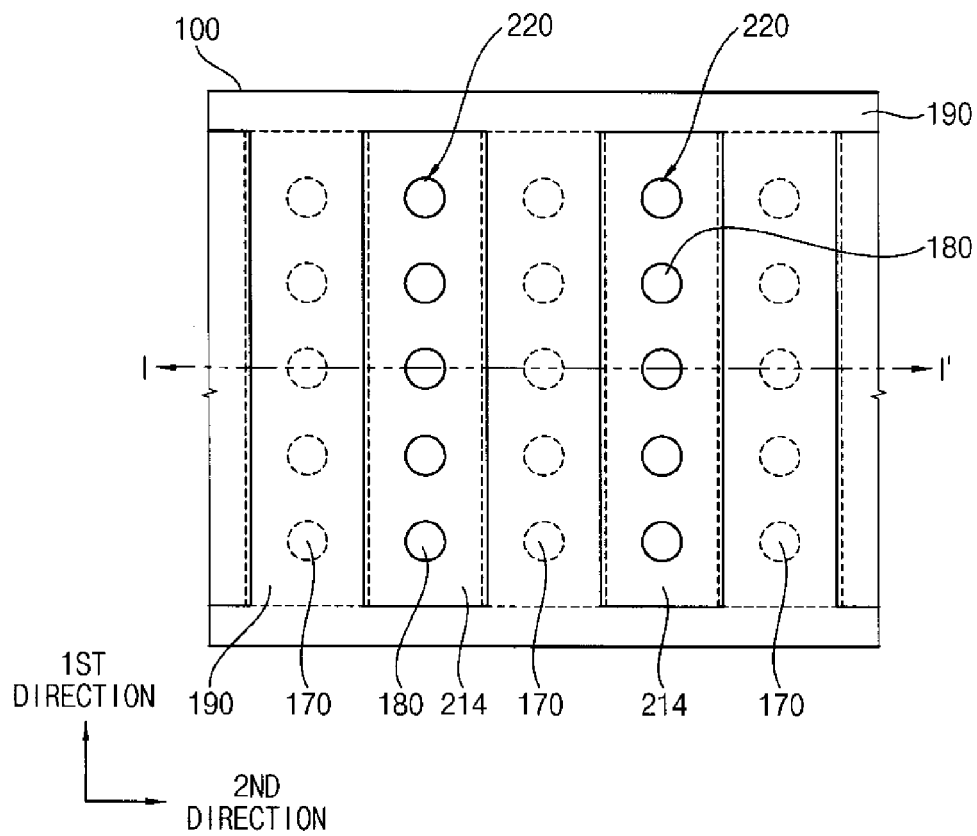

Referring to FIGS. 13 and 14, a process substantially the same as or similar to that illustrated with reference to FIGS. 7 and 8 may be performed.

Thus, the third material layers 212 may be removed to form second holes 220 exposing the second neutral layer 180.

Figure 15:
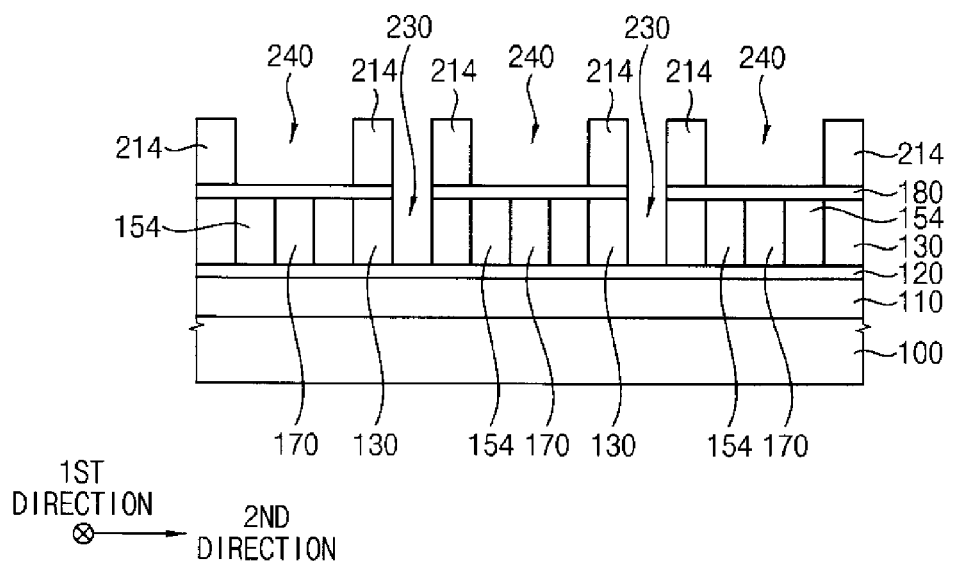
Figure 16:
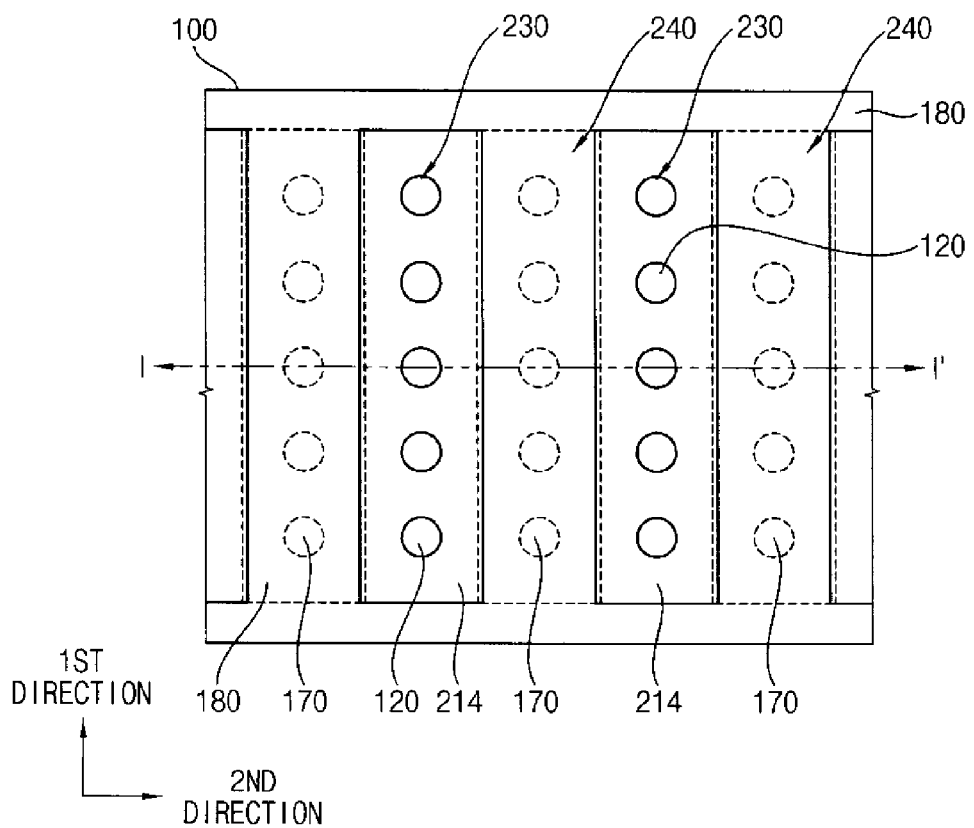

Referring to FIGS. 15 and 16, the portions of the second neutral layer 180 exposed by the second holes 220 and portions of the first guide pattern 130 thereBeneath may be etched to form third holes 230 that may expose portions of the first neutral layer 120 and may be in fluid communication with the second holes 220.

When the first guide pattern 130 is partially etched by the etching process, at least portions of the second guide pattern 190 may be also etched. Thus, spaces 240 exposing portions of the second neutral layer 180 may be formed. When a portion of the second guide pattern 190 remains, the remaining portion of the second guide pattern 190 may be removed by an additional process, for example, an ashing process and/or a stripping process.

Figure 17:
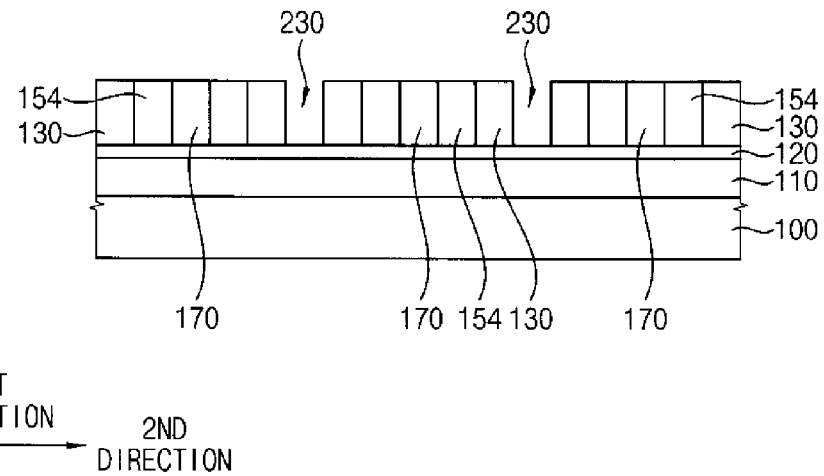
Figure 18:
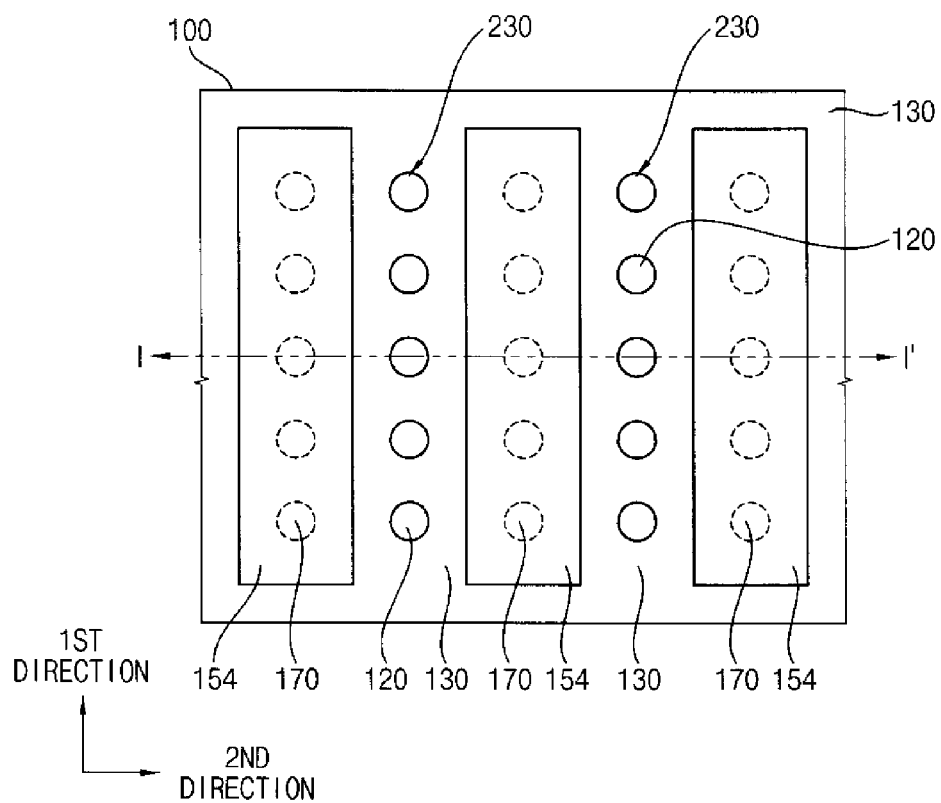

Referring to FIGS. 17 and 18, the fourth material layer 214 and the second neutral layer 180 may be removed. Thus, top surfaces of the first guide pattern 130, the second material layer 154 and the insulation layer pattern 170 may be exposed.

Figure 19:
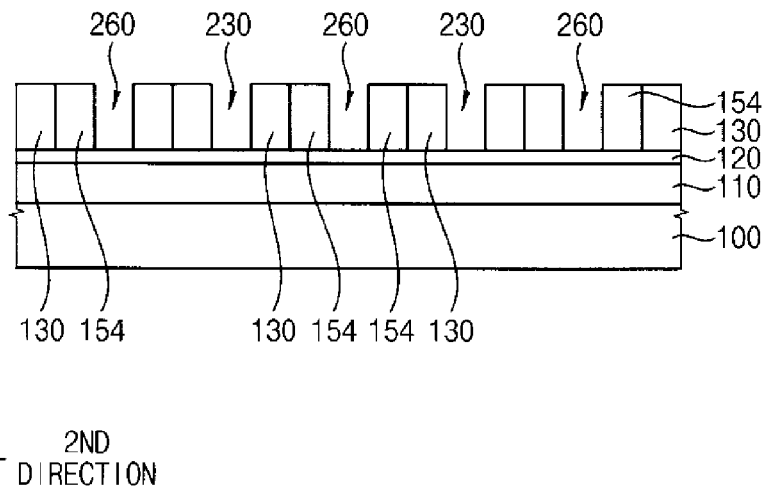
Figure 20:
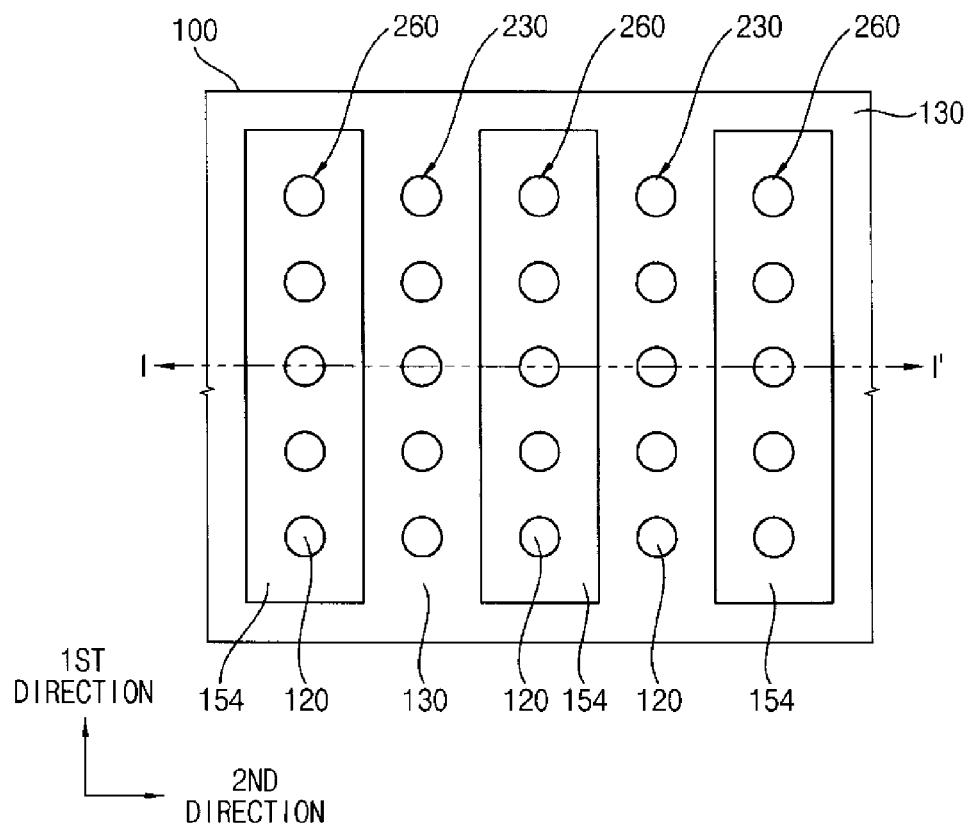

Referring to FIGS. 19 and 20, the insulation layer pattern 170 may be removed to form fourth holes 260 exposing portions of the first neutral layer 120.

Figure 21:
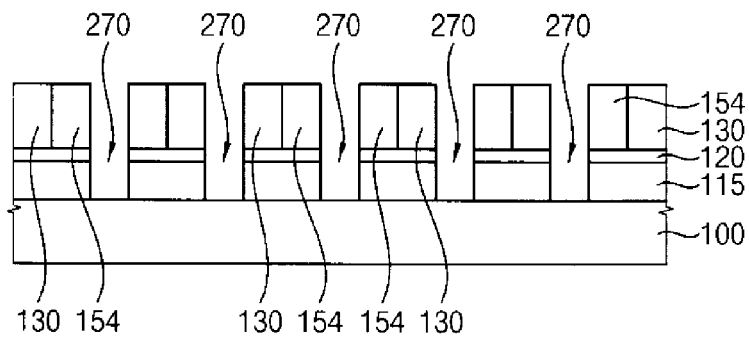
Figure 22:
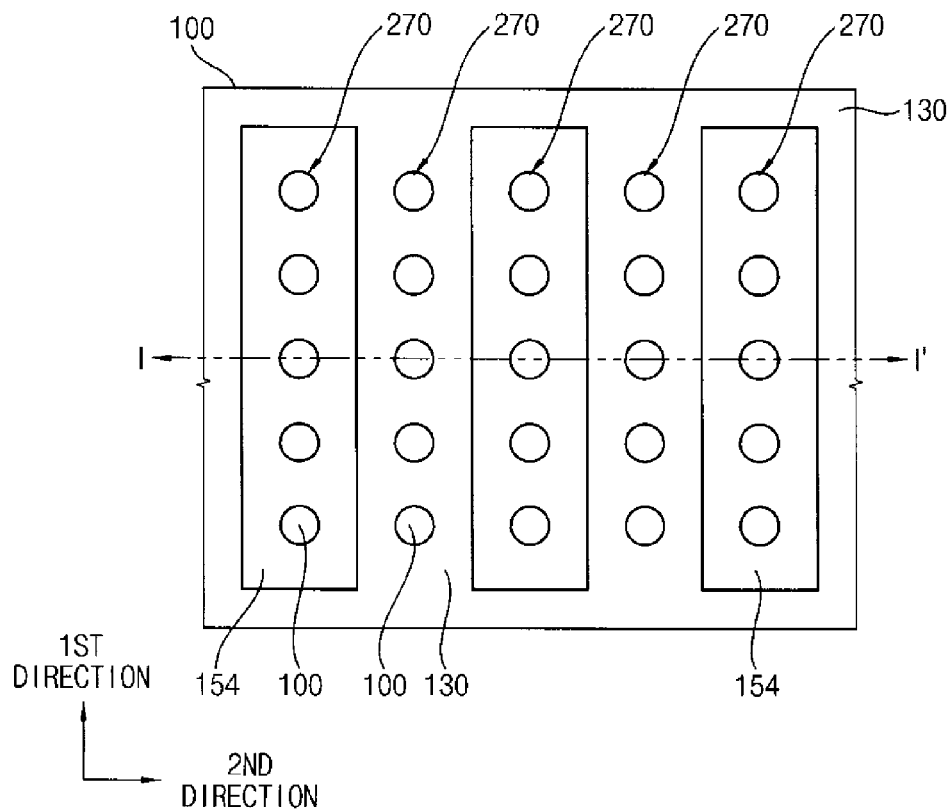

Referring to FIGS. 21 and 22, the portions of the first neutral layer 120 exposed by the third and fourth holes 230 and 260 and portions of the etching target layer 110 thereBeneath may be etched to form fifth holes 270. Thus, the etching target layer 110 may be transformed into an etching target layer pattern 115.

Figure 23:
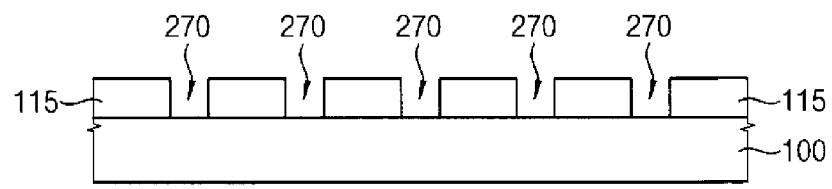
Figure 24:
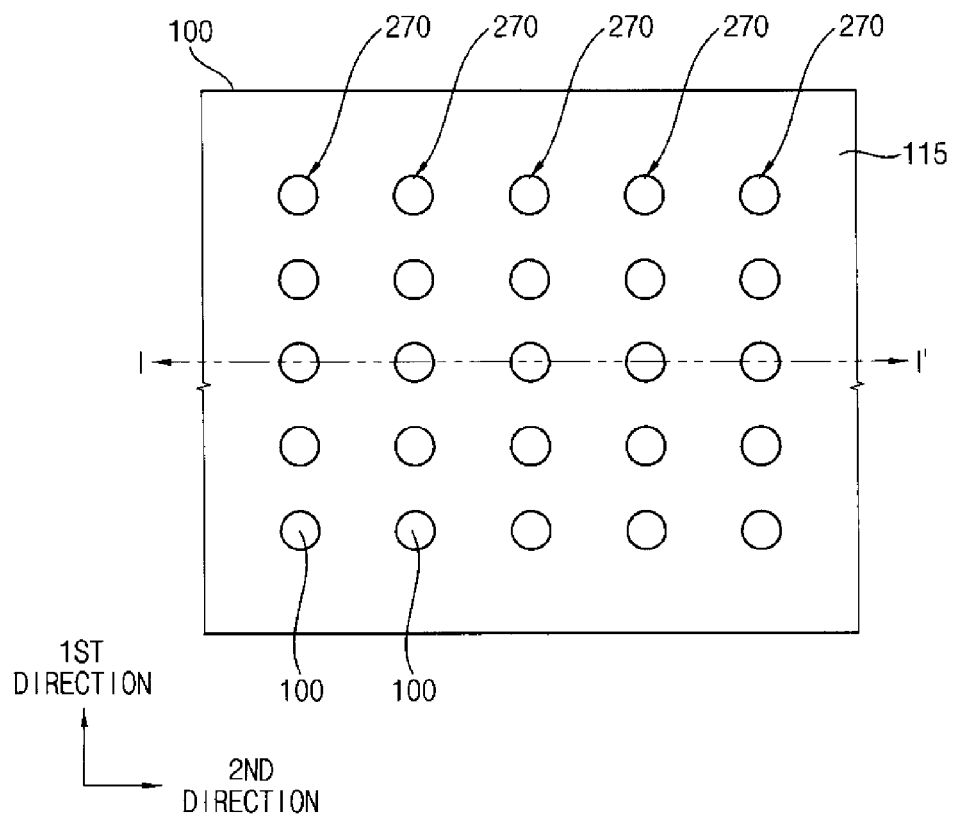

Referring to FIGS. 23 and 25, the first guide pattern 130, the second material layers 154 and the first neutral layer 120 may be removed. Thus, the etching target layer pattern 115 may be formed on the substrate 100, and the fifth holes 270 penetrating though the etching target layer pattern 115 may be formed. In one example embodiment, the fifth holes 270 may be arranged in the first and the second directions at substantially the same pitch P, and the pitch P may be substantially the same as the first and the second pitches P1 and P2 and may be about half the size of the third and the fourth pitches P3 and P4. That is, the fifth holes 270 may be arranged in the first and the second directions at a pitch of about 20 to about 50 nm.

A contact structure (not shown) may be formed in the fifth holes 270. Thus, the fifth holes 270 may serve as contact holes.

As illustrated above, in example embodiments, the first guide pattern 130 having the first openings 140 may be formed on the etching target layer 110, and the first BCP structure 155 including a plurality of first material layers 152 self-assembled in the first direction at the first pitch P1 in the first openings 140 and the second material layer 154 filling the remaining portions of the first openings 140 may be formed. The first holes 160 may be formed by removing the first material layers 152. The second guide pattern 190 having the second openings 200 may be formed on the first guide pattern 130 and the second material layer 154, and a second BCP structure 215 including a plurality of third material layers 212 self-assembled in the first direction at the second pitch P2 in the second openings 200 and the fourth material layer 214 filling the remaining portions of the second openings 200 may be formed. The portions of the etching target layer 110 overlapped by the first holes 160 or the second holes 220 may be etched to form the fifth holes 270 serving as contact holes.

A plurality of first openings 140, each of which may be extended in the first direction, may be formed through the first guide pattern 130 in the second direction, a plurality of second openings 200, each of which may be extended in the first direction, may be also formed through the second guide pattern 190. The second openings 200 may be arranged between the first openings 140 in a plan view.

In one example embodiment, as the first and the second openings 140 and 200 may be extended in the first direction by substantially the same length as each other, when the first and the third material layers 152 and 212 self-assembled in the first and second openings 140 and 200, respectively, include substantially the same material as each other, the first and second holes 160 and 220 in the respective first and second openings 140 and 200 may be arranged at substantially the same distances. That is, the first and the second pitches P1 and P2 may be substantially the same. Also, in one example embodiment, both ends of the first openings 140 may be collinear with those of the second openings 200, respectively, in a plan view, and thus, when the first and the third materials 152 and 212 self-assembled in the respective first and second openings 140 and 200 include substantially the same material as each other, the first and the second holes 160 and 220 may be collinear to each other in the second direction. That is, the fifth holes 270 formed by the first and the second holes 160 and 220 may arranged in a rectangular shape.

Further, when the first and second openings 140 and 200 have substantially the same size, and when the first distance D1 between the first openings 140 and the second distance D2 between the second openings 200 are twice as long as the first and second pitches P1 and P2, respectively, the fifth holes 270 formed by the first and the second holes 160 and 220 may have a square shape.

Alternatively, by an adjustment of a position of the second guide pattern 190, for example, by a shift of the second guide pattern 190 in the second direction at a distance or a shift of the second openings 200 through the second guide pattern 190 in the second direction at a distance, the fifth holes 270 formed by the first and the second holes 160 and 220 may have a shape different from the rectangular shape. Particularly, when the position of the second guide pattern 190 is shifted in the first direction at a distance or when the position of the second openings 200 is shifted in the first direction, the fifth holes 270 formed by the first and the second holes 160 and 220 may be arranged in a hexagonal shape, for example.

That is, by an adjustment of positions or sizes of the first and the second guide patterns 130 and 190, and by an adjustment of positions or sizes of the first and the second openings 140 and 200 therein, contact holes having a desired arrangement may be formed.

Also, by a limit of a resolution of a photolithography process, for example, when openings or contact holes having a distance therebetween equal to or more than about 80 nm may be formed, a direct self assembly (DSA) process and an etching process may be sequentially performed using two guide patterns including openings, and thus contact holes having more minute distances, that is, half the distances thereof may be obtained.

Figure 50:
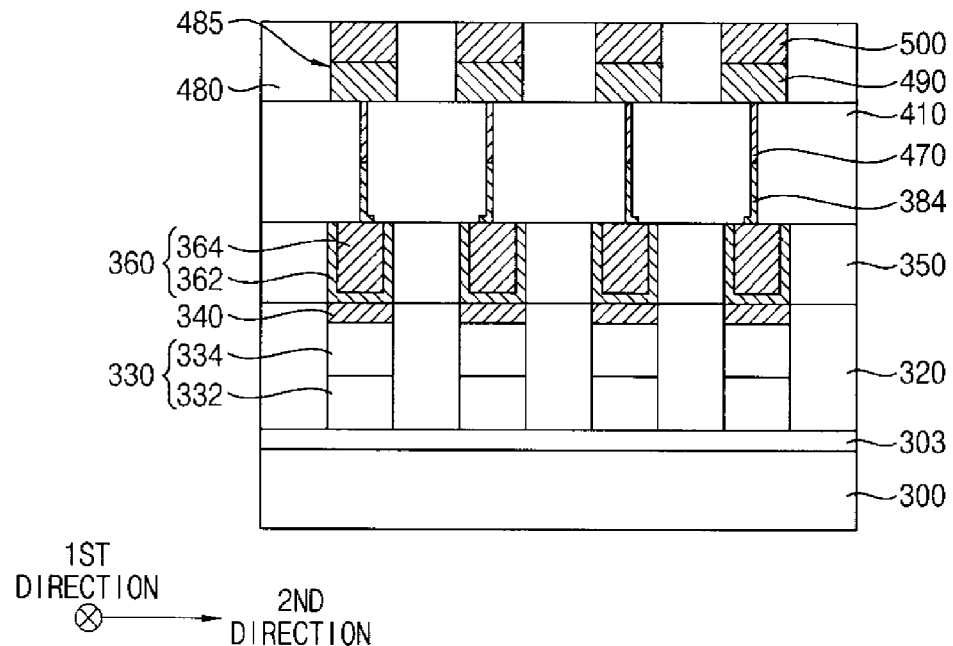
Figure 51:
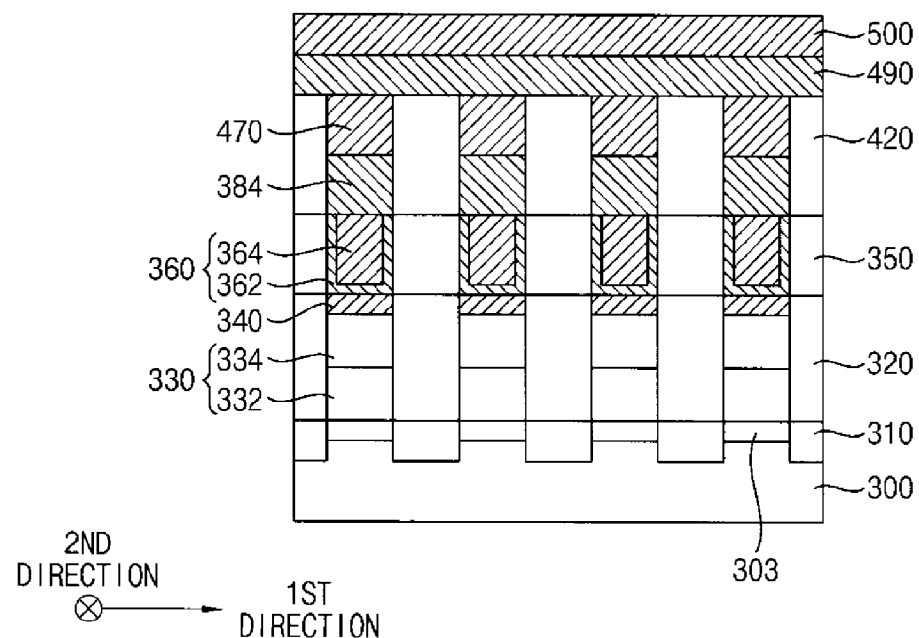

FIGS. 26 to 51 are cross-sectional views illustrating stages of a method of manufacturing a phase change memory device using a method of forming contact holes in accordance with example embodiments, and FIG. 51 is a perspective view illustrating a phase change memory device manufactured by using the method thereof. Particularly, FIGS. 26, 28, 30, 32, 34, 36, 38, 40, 42, 44, 46, 48 and 40 are cross-sectional views cut along a second direction, and FIGS. 27, 29, 31, 33, 35, 37, 39, 41, 43, 45, 47 and 49 are cross-sectional views cut along a first direction substantially perpendicular to the second direction. The method of manufacturing the phase change memory device may include processes substantially the same as or similar to the method of forming contact holes illustrated with reference to FIGS. 1 to 25, and thus detailed descriptions thereon are omitted herein.

Figure 26:
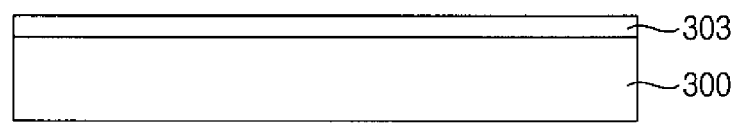
FIGS. 26 to 51 are cross-sectional views illustrating stages of a method of manufacturing a phase change memory device using a method of forming contact holes in accordance with example embodiments.
Figure 26:
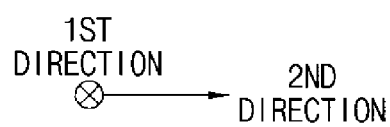
Figure 27:
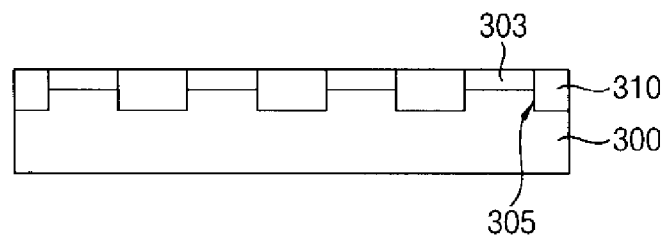
Figure 27:
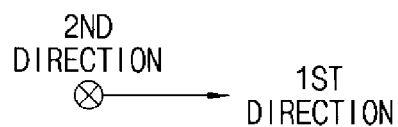

Referring to FIGS. 26 and 27, after first impurities may be implanted into an upper portion of a substrate 300 to form an impurity region, an isolation layer pattern 310 may be formed at an upper portion of the substrate 300 to divide the substrate 300 into an active region and a field region, and word lines 303 may be formed.

In example embodiments, the first impurities may be implanted by an ion implantation process. The first impurities may include n-type impurities, e.g., phosphorus, arsenic, etc., or p-type impurities, e.g., boron, gallium, etc. In an example embodiment, the first impurities may be n-type impurities. A well region (not shown) doped with impurities of a conduction type different from that of the first impurities may be further formed under the impurity region.

In example embodiments, the isolation layer pattern 310 may be formed by a shallow trench isolation (STI) process. Particularly, after trenches 305 may be formed on the substrate 300, an isolation layer may be formed on the substrate 300 to sufficiently fill the trenches 305, and an upper portion of the isolation layer may be planarized until a top surface of the substrate 300 may be exposed to form the isolation layer pattern 310. The isolation layer may be formed to include an oxide, e.g., boro phospho silicate glass (BPSG), phospho silicate glass (PSG), undoped silicate glass (USG), flowable oxide (FOX), tetra ethyl ortho silicate (TEOS), plasma enhanced tetra ethyl ortho silicate (PE-TEOS), high density plasma chemical vapor deposition (HDP-CVD) oxide, etc. In example embodiments, the planarization process may be formed by a chemical mechanical polishing (CMP) process and/or an etch back process. In example embodiments, a plurality of isolation layer patterns 310 may be formed in the first direction, each of which may extend in the second direction substantially perpendicular to the top surface of the substrate 300. Thus, a plurality of the active regions may be also formed in the first direction, each of which may extend in the second direction.

In example embodiments, the isolation layer patterns 310 may be formed to have a bottom surface lower than that of the impurity region, and thus the impurity region may be divided into a plurality of word lines 303 by the isolation layer patterns 310. In example embodiments, a plurality of word lines 303 may be formed in the first direction, each of which may extend in the second direction.

Alternatively, the isolation layer pattern 310 may be formed first by a STI process, and an ion implantation process may be performed to form the impurity region, that is, the word lines 303.

Figure 28:
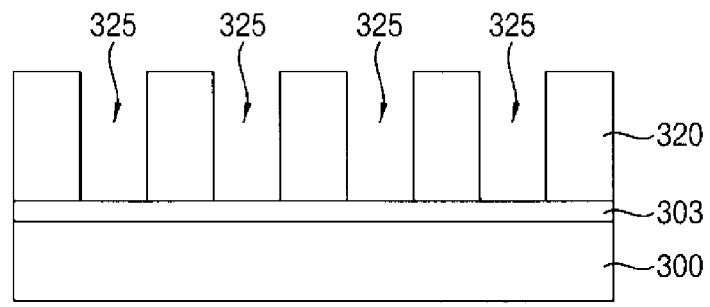
Figure 29:
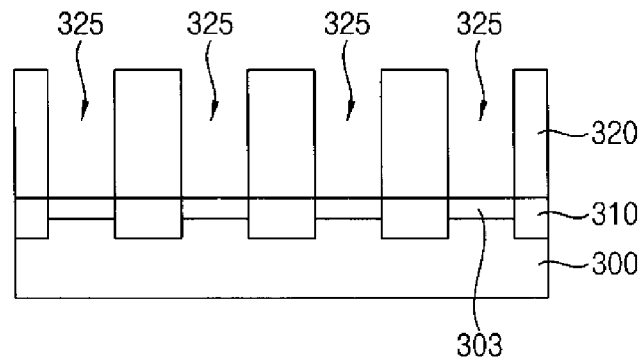

Referring to FIGS. 28 and 29, processes substantially the same as or similar to those illustrated with reference to FIGS. 1 to 25 may be performed such that a first insulation layer 320 having a plurality of first contact holes 325 arranged in the first and the second directions at regular distances may be formed on the substrate 300 and the isolation layer pattern 310. The first contact holes 325 may form a first contact hole array. In example embodiments, the first contact holes 325 may expose top surfaces of the word lines 303. The first insulation layer 320 may be formed to include an oxide, e.g., silicon oxide.

Figure 30:
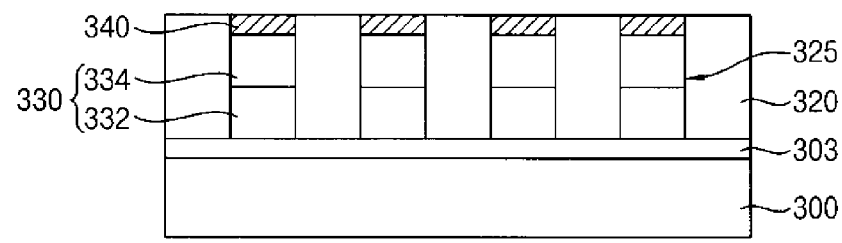
Figure 31:
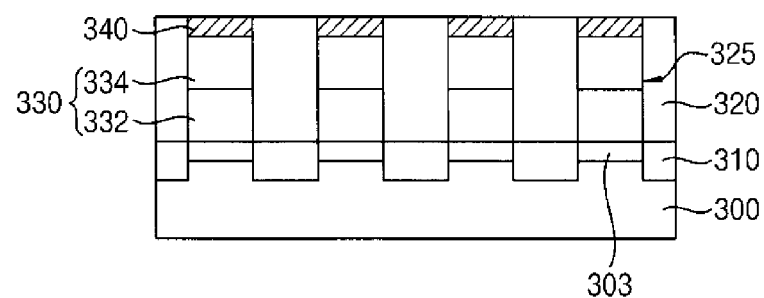

Referring to FIGS. 30 and 31, a diode 330 and an ohmic pattern 340 may be formed to fill each first contact hole 325.

In example embodiments, a selective epitaxial growth (SEG) process may be performed using the exposed top surfaces of the word lines 303 as a seed layer to form a silicon layer filling the first contact holes 325, and second and third impurities may be implanted into lower and upper portions of the silicon layer to form the diode 330. The lower portion of the silicon layer doped with the second impurities and the upper portion of the silicon layer doped with the first impurities may be defined as a lower diode layer 332 and an upper diode layer 334, respectively. Before implanting the second and third impurities thereinto, a planarization process may be performed on a top surface of the silicon layer so that a top surface of the diode 330 may have a height substantially the same as that of the first insulation layer 320.

In an example embodiment, the second impurities may include n-type impurities, e.g., phosphorous, arsenic, etc., and the third impurities may include p-type impurities, e.g., boron, gallium, etc.

The ohmic pattern 340 may be formed by forming a metal layer on the diode 330 and the first insulation layer 320 and by performing a heat treatment thereon so that the metal layer and the diode 330 may be reacted with each other. A portion of the metal layer that has not been reacted with the diode 330 may be removed. In example embodiments, the metal layer may be formed to include, e.g., cobalt, nickel, tungsten, etc. Thus, the ohmic pattern 340 may be formed to include a metal silicide, e.g., cobalt silicide, nickel silicide, tungsten silicide, etc. Alternatively, the ohmic pattern 340 may be formed by directly implanting metal ion into an upper portion of the diode 330. The ohmic pattern 340 may reduce a contact resistance between the diode 330 and a contact plug 360 subsequently formed (refer to FIGS. 34 and 35), and the process for forming the ohmic pattern 340 may be skipped.

The diode 330 and the ohmic pattern 340 may be formed in each first contact hole 325, and thus a plurality of diodes 330 and a plurality of ohmic patterns 340 may be formed to define a diode array and an ohmic pattern array, respectively.

Figure 32:
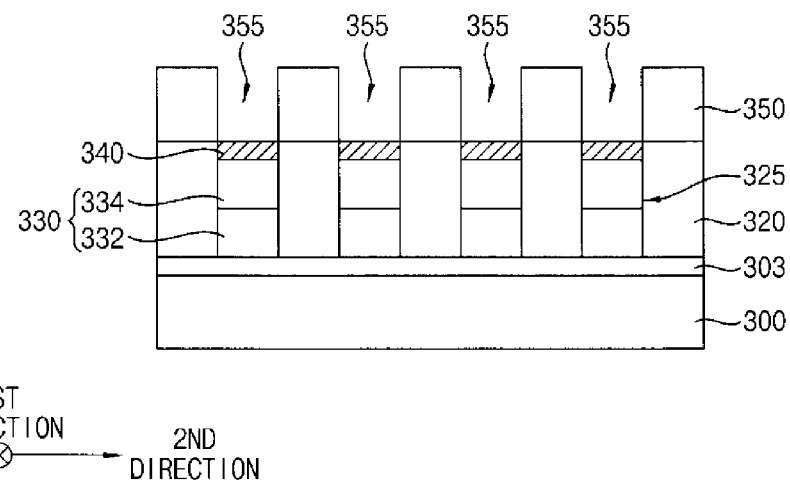
Figure 33:
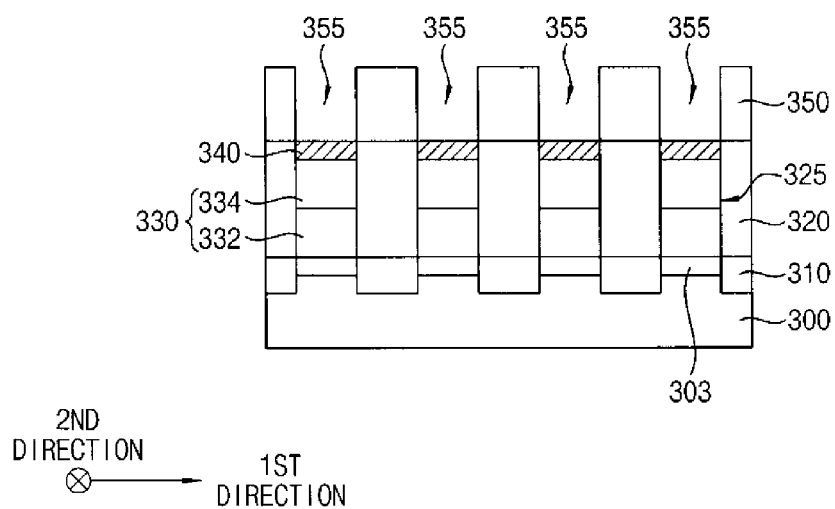

Referring to FIGS. 32 and 33, processes substantially the same as or similar to those illustrated with reference to FIGS. 1 to 25 may be performed such that a second insulation layer 350 having a plurality of second contact holes 355 arranged in the first and the second directions at regular distances may be formed on the ohmic pattern 340 and the first isolation layer pattern 320. The second contact holes 355 may form a second contact hole array. In example embodiments, the second contact holes 355 may expose top surfaces of the ohmic patterns 340. The second insulation layer 350 may be formed to include an oxide, e.g., silicon oxide.

Figure 34:
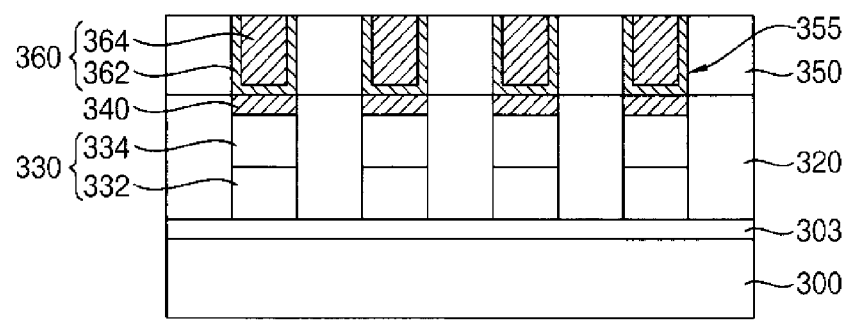
Figure 35:
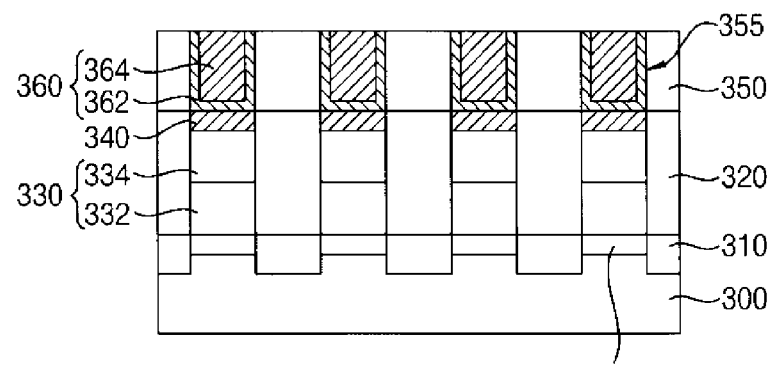

Referring to FIGS. 34 and 35, a contact plug 360 may be formed to fill each second contact hole 355.

In example embodiments, the contact plug 360 may be formed by forming a first barrier layer on the exposed top surfaces of the ohmic patterns 340, sidewalls of the second contact holes 355 and a top surface of the second insulation layer 350, by forming a first conductive layer on the first barrier layer to sufficiently fill remaining portions of the second contact holes 355, and by planarizing the first conductive layer and the first barrier layer until a top surface of the second insulation layer 350 may be exposed. Thus, the contact plug 360 may be formed to include a first barrier layer pattern 362 and a first conductive layer pattern 364, and the first barrier layer pattern 362 may surround a sidewall and a bottom of the first conductive layer pattern 364. The first barrier layer may be formed to include a metal or a metal nitride, e.g., titanium, titanium nitride, and the first conductive layer may be formed to include a low resistance metal, e.g., copper, tungsten, aluminum, etc. In an example embodiment, the process for forming the contact plug 360 may be skipped.

The contact plug 360 may be formed in each second contact hole 355, and thus a plurality of the contact plugs 360 may be formed both in the first and second directions to define a plug array.

Figure 36:
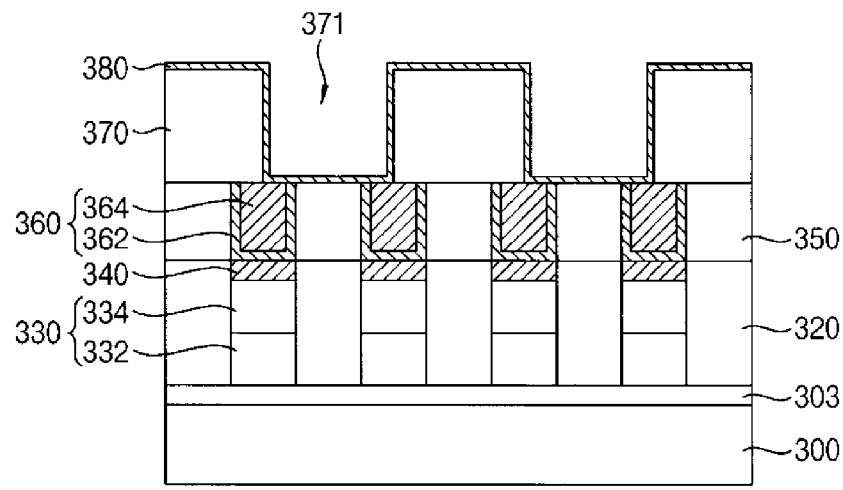
Figure 37:
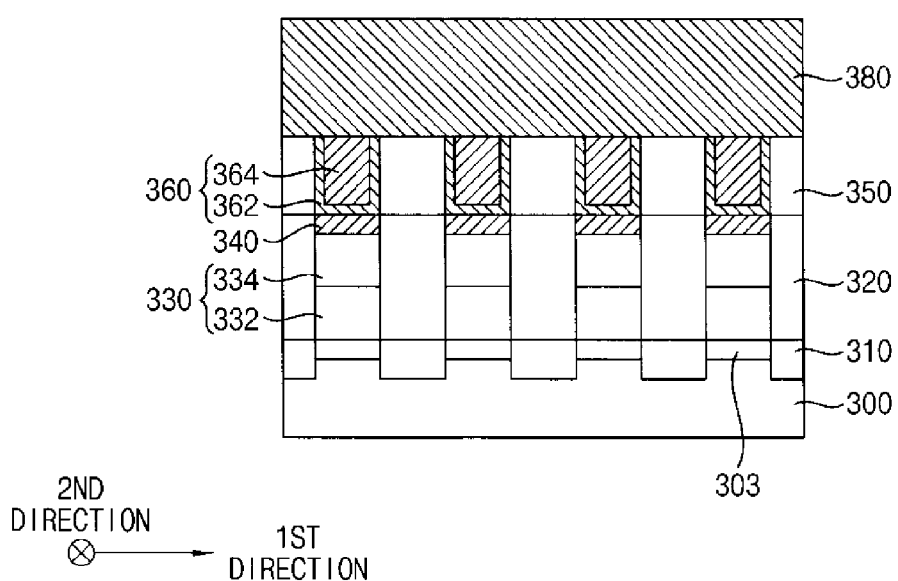

Referring to FIGS. 36 and 37, a third insulation layer 370 may be formed on the second insulation layer 350 and the contact plugs 360, the third insulation layer 370 may be partially removed to form a first opening 371 exposing top surfaces of the contact plug 360 and the second insulation layer 350, and a lower electrode layer 380 may be formed on the exposed top surfaces of the contact plug 360 and the second insulation layer 350, a sidewall of the first opening 371 and a top surface of the third insulation layer 370.

The third insulation layer 370 may be formed to include a nitride, e.g., silicon nitride.

In example embodiments, the first opening 371 may be formed to extend in the first direction, and a plurality of first openings 371 may be formed in the second direction. Two contact plugs 360 adjacent to each other in the second direction may be exposed by the same first opening 371.

The lower electrode layer 380 may be formed to include a metal or a metal compound such as a metal nitride or a metal silicon nitride. The lower electrode layer 380 may be formed by a chemical vapor deposition (CVD) process, an atomic layer deposition (ALD) process, a sputtering process, an electron beam deposition (EBD) process, etc. In an example embodiment, the lower electrode layer 380 may be conformally formed on the exposed top surfaces of the contact plugs 360 and the second insulation layer 350, the sidewall of the first opening 371 and the top surface of the third insulation layer 370.

Figure 38:
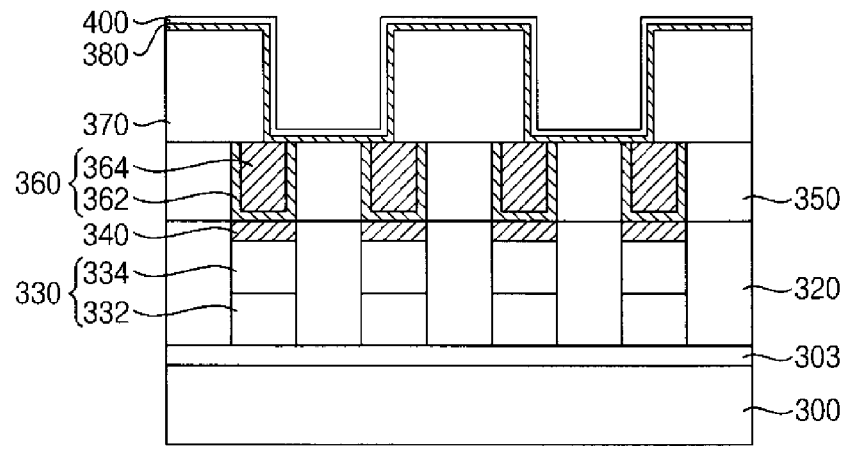
Figure 38:
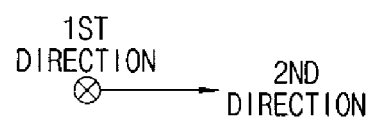
Figure 39:
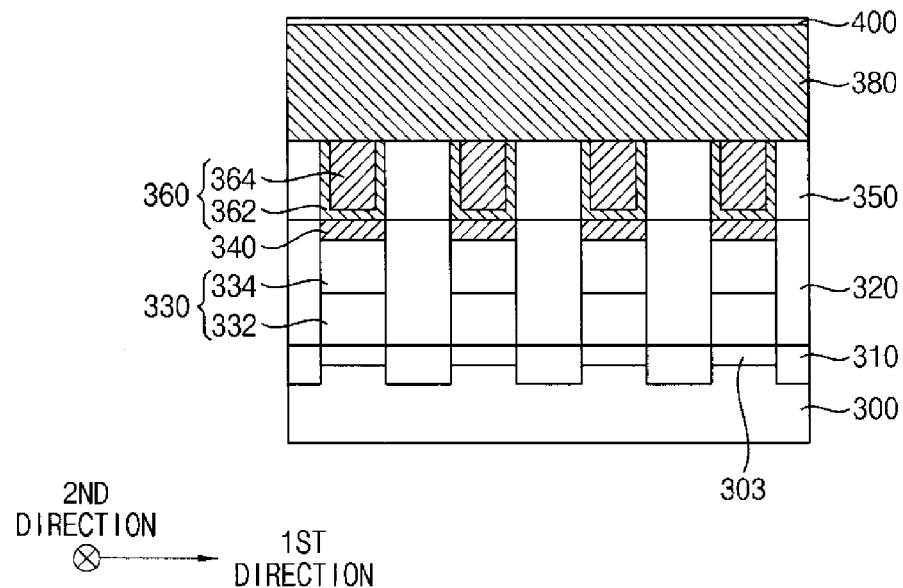

Referring to FIGS. 38 and 39, a spacer layer 400 may be formed on the lower electrode layer 380.

The spacer layer 400 may be formed to include a nitride, e.g., silicon nitride, and may be formed to include a material substantially the same as that of the third insulation layer 370.

Figure 40:
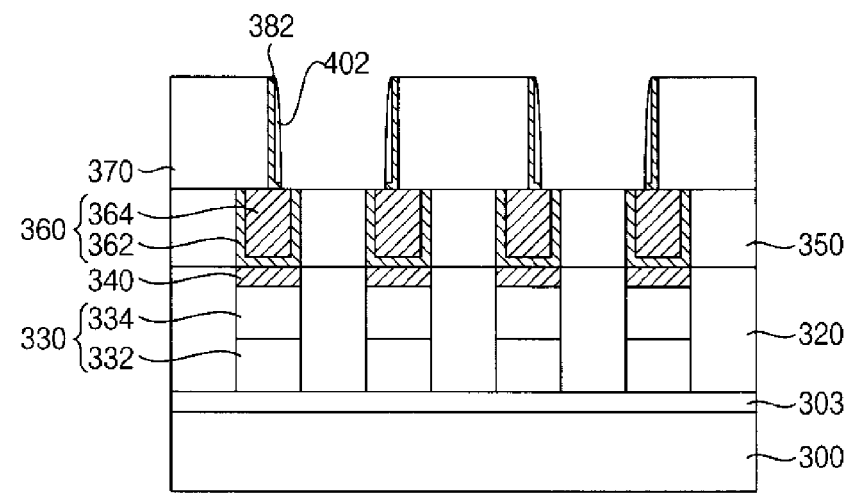
Figure 41:
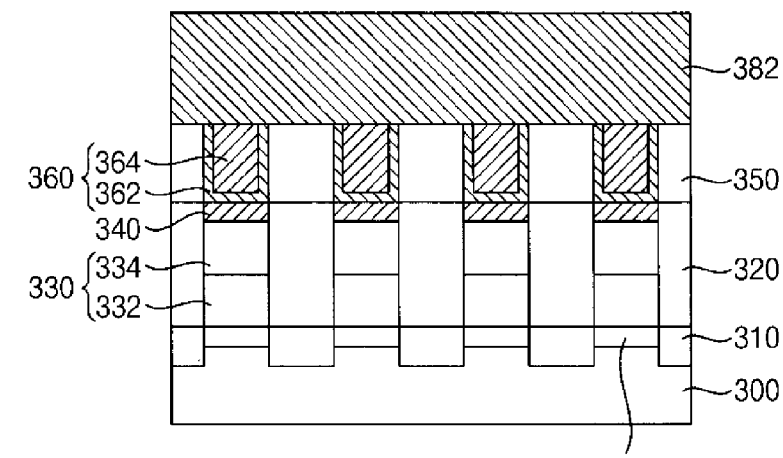

Referring to FIGS. 40 and 41, the spacer layer 400 may be etched to form a spacer 402, and the lower electrode layer 380 may be etched using the spacer 402 as an etching mask to form a lower electrode layer pattern 382.

In example embodiments, the spacer layer 400 may be anisotropically etched to form the spacer 402, and the spacer 402 may be formed to extend in the first direction adjacent to the sidewall of the first opening 371. Thus, two spacers 402 may be formed in one first opening 371, and according as a plurality of first openings 371 may be formed in the second direction, a plurality of spacers 402 may be also formed in the second direction.

The lower electrode layer pattern 382 may be formed to extend in the first direction on the sidewall of the first opening 371, and a plurality of first electrode layer patterns 382 may be formed in the second direction. Each lower electrode layer pattern 382 may have a cross-section cut along the second direction of which a shape may be an "L" shape or a "J-like" shape. That is, the lower electrode layer pattern 382 may be conformally formed on the sidewall of the first opening 371 and the exposed top surface of the contact plug 360, and may have the cross-section of an "L" shape. Thus, a contact area between the lower electrode layer pattern 382 and a phase change material layer pattern 470 subsequently formed (refer to FIGS. 48 and 49) may be reduced while a contact area between the lower electrode layer pattern 382 and the contact plug 360 may be increased, so that the phase change material layer pattern 470 may be efficiently heated even with a small current.

Figure 42:
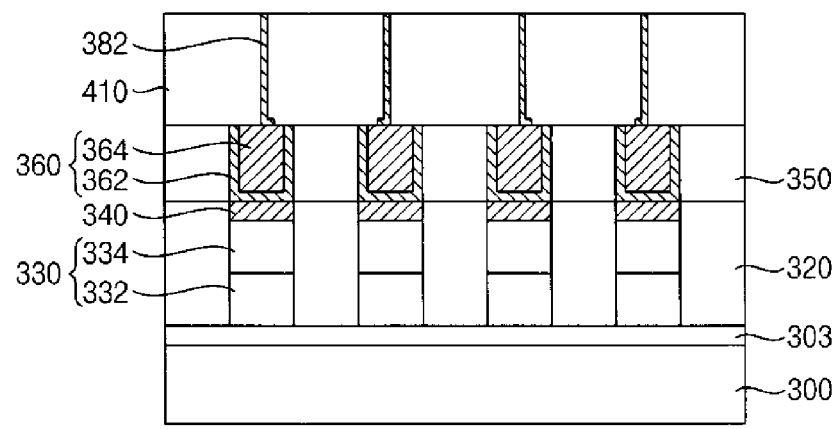
Figure 43:
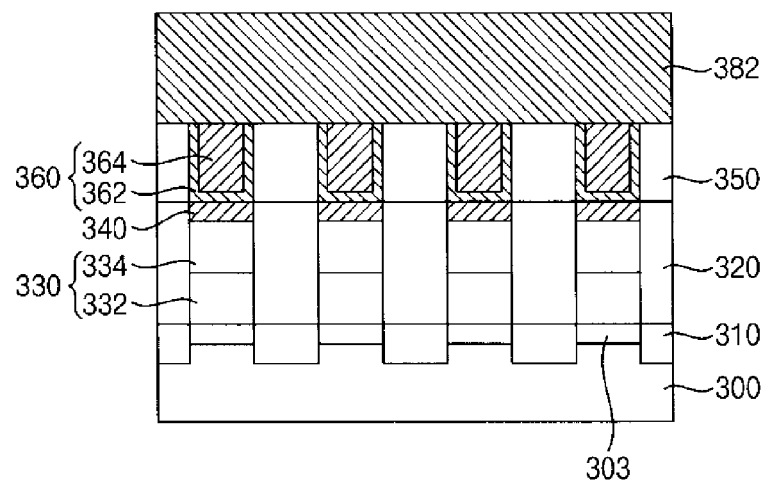

Referring to FIGS. 42 and 43, a fourth insulation layer 410 sufficiently filling a remaining portion of the first opening 371 may be formed on the exposed top surfaces of the contact plugs 360 and the second insulation layer 350, the spacers 402, the lower electrode layer patterns 382 and a top surface of the third insulation layer 370, and may be planarized until top surfaces of the lower electrode layer patterns 382 may be exposed.

The fourth insulation layer 410 may be formed to include a nitride, e.g., silicon nitride, and may be formed to include a material substantially the same as that of the spacer 402 and the third insulation layer 370. Thus, the fourth insulation layer 410, the spacer 402 and the third insulation layer 370 may be merged, and hereinafter, the merged layer may be referred to simply as a fourth insulation layer 410. The fourth insulation layer 410 may surround sidewalls of the lower electrode layer patterns 382 and formed on the contact plugs 360 and the second insulation layer 350.

Figure 44:
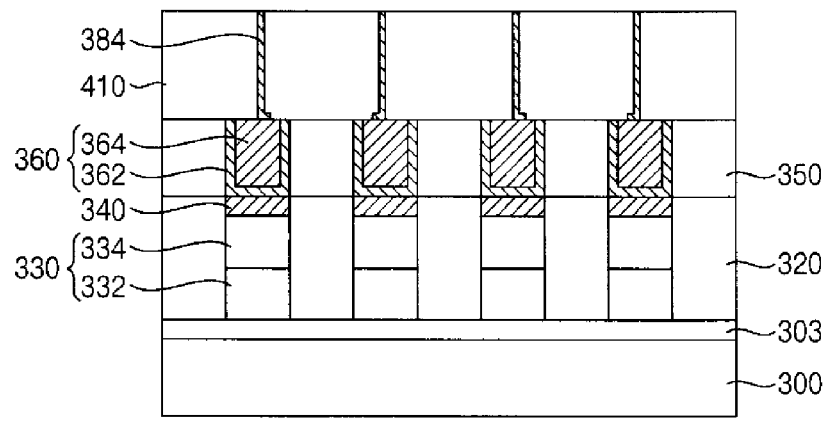
Figure 45:
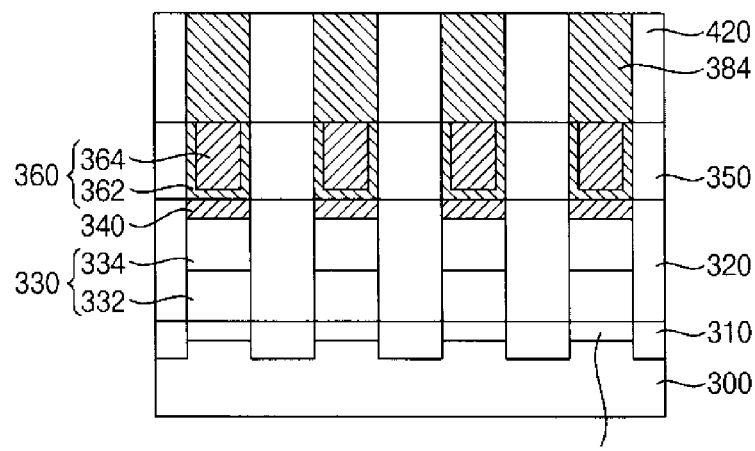

Referring FIGS. 44 and 45, as an etching process using a photoresist pattern (not shown) extending in the second direction may be performed to etch the lower electrode pattern 382 so that a plurality of lower electrodes 384 may be formed in the first direction. The plurality of lower electrode patterns 382 may be formed in the second direction, and thus a plurality of lower electrodes 384 may be also formed in the second direction. As a result, a plurality of the lower electrodes 384 may be formed both in the first and second directions to define a lower electrode array.

When the lower electrode pattern 382 is etched, the fourth insulation layer 410 may be partially removed to form a second opening (not shown), and a fifth insulation layer 420 may be formed to fill the second opening.

Figure 46:
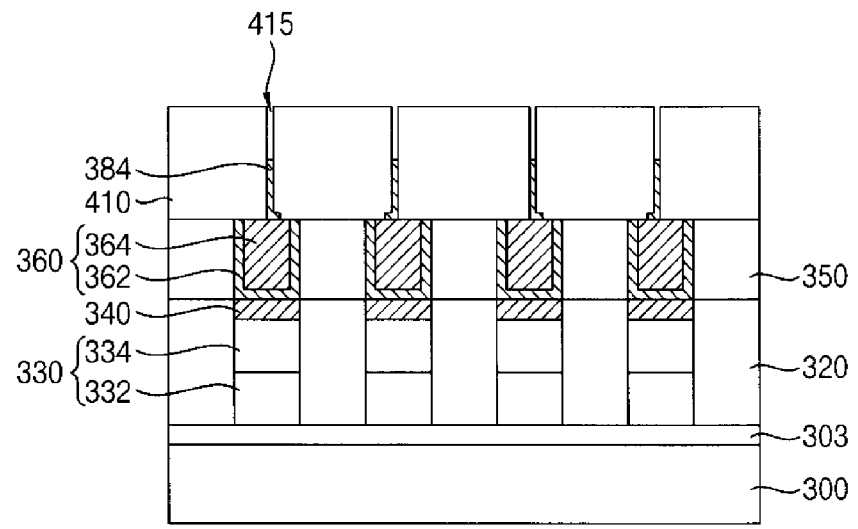
Figure 47:
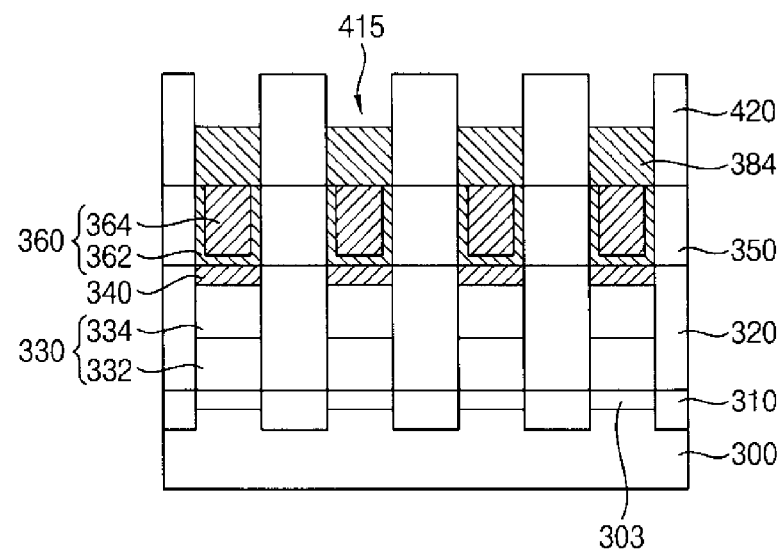

Referring to FIGS. 46 and 47, upper portions of the lower electrodes 384 may be removed to form a recess 415.

In example embodiments, the lower electrodes 384 may be removed by a wet etching process, and the wet etching process may be performed using, e.g., SC1 solution as an etching solution.

The plurality of lower electrodes 384 may be formed both in the first and second directions to form the first lower electrode array, and thus a plurality of recesses 415 may be formed both in the first and second directions to form a recess array.

Figure 48:
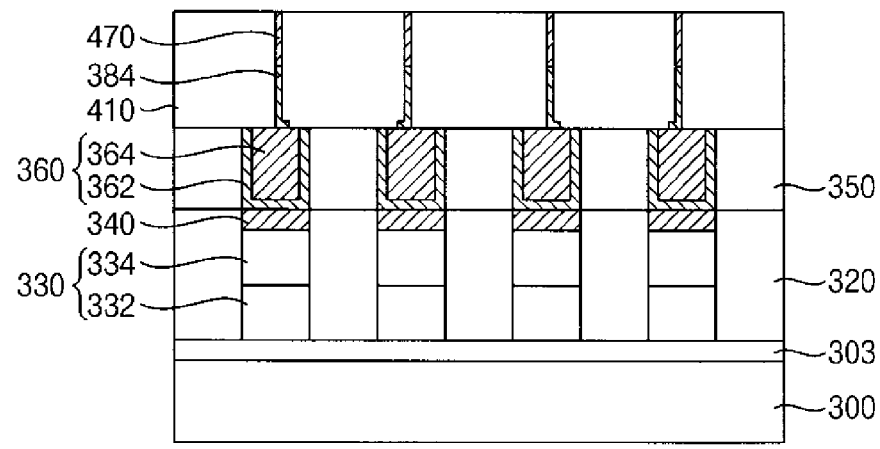
Figure 49:
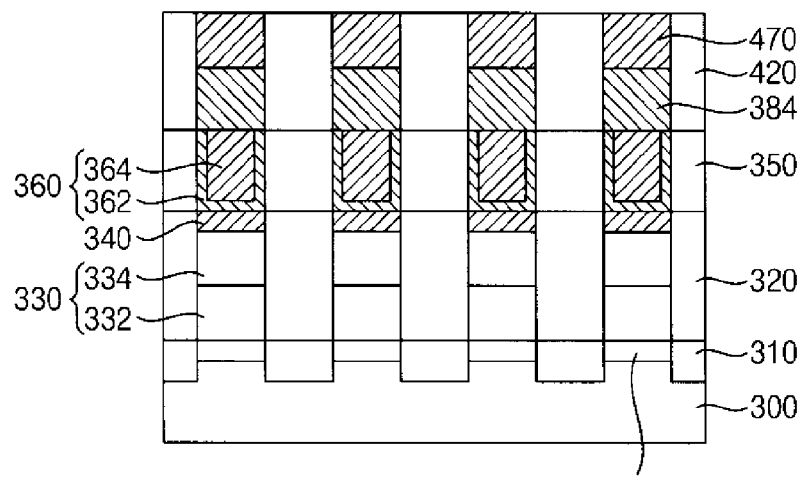

Referring to FIGS. 48 and 49, the phase change material layer pattern 470 may be formed to fill each recess 415.

In example embodiments, a phase change material layer sufficiently filling the recesses 415 may be formed on the lower electrodes 384 and the fourth and the fifth insulation layer pattern 410 and 420, and an upper portion of the phase change material layer may be planarized to form the phase change material layer pattern 470.

In example embodiments, the phase change material layer may be formed to include chalcogen material, e.g., GeSbTe (GST) or chalcogen material doped with carbon, nitrogen and/or a metal by a sputtering process or an ALD process.

A plurality of recesses 415 may be formed both in the first and second directions to form the third recess array, and thus a plurality of phase change material layer patterns 470 may be formed both in the first and second directions to form a phase change material layer pattern array.

Each first phase change material layer pattern 470 may fill the recess 415 that may be formed by removing the upper portion of each lower electrode 384, and thus a bottom surface of each phase change material layer pattern 470 may have a shape substantially the same as that of each lower electrode 384.

Figure 52:
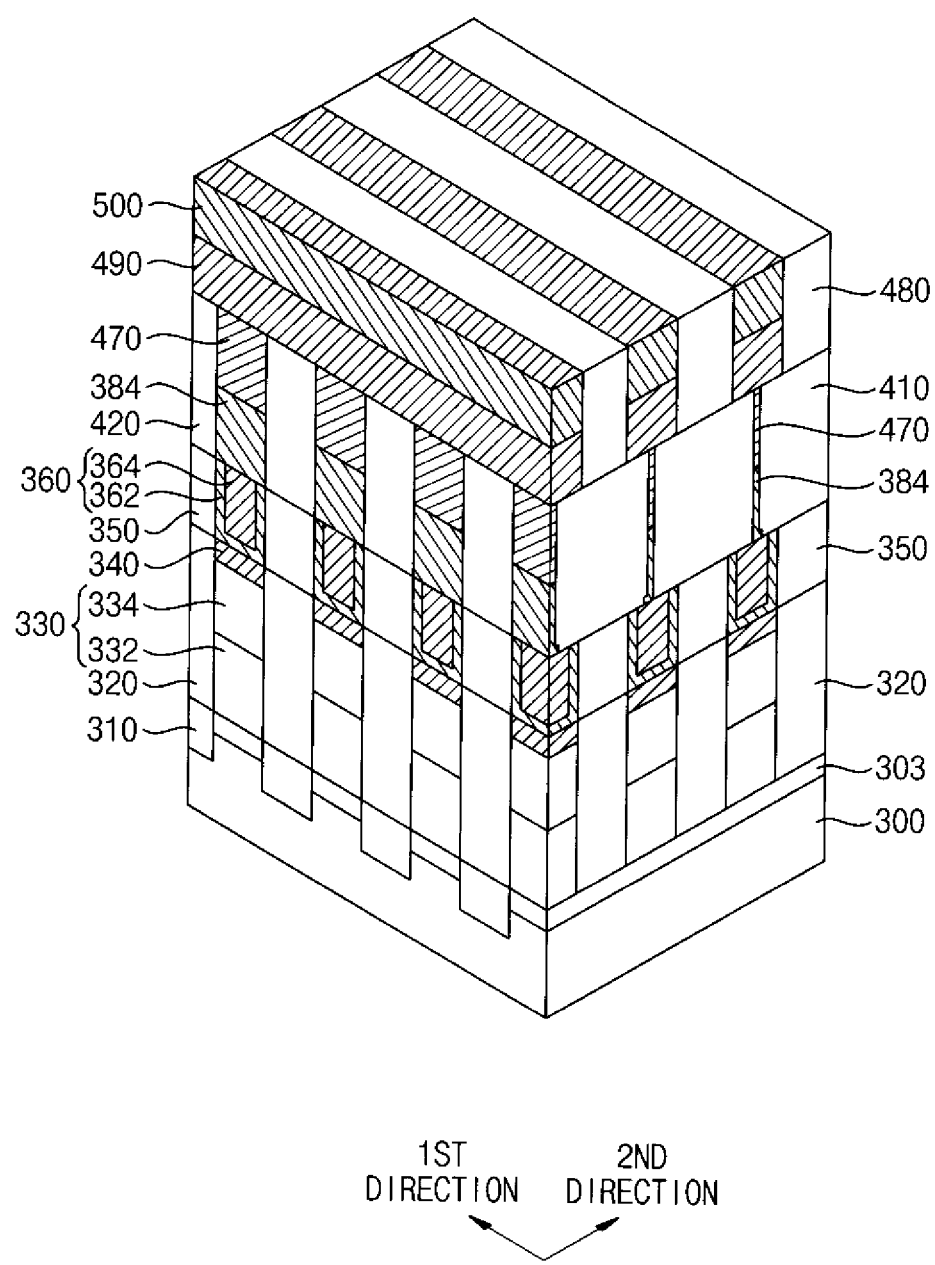

Referring to FIGS. 50 to 52, after a sixth insulation layer 480 may be formed on the fourth and the fifth insulation layer patterns 410 and 420 and the phase change material layer pattern 470, a third opening 485 exposing the top surfaces of the phase change material layer patterns 470 and portions of the top surfaces of the fourth and the fifth insulation layer patterns 410 and 420 may be formed through the sixth insulation layer 480. An upper electrode 490 and a bit line 500 may be sequentially formed to fill the third opening 485 so that the phase change memory device may be manufactured.

The sixth insulation layer 480 may be formed to include an oxide, e.g., silicon oxide or a nitride, e.g., silicon nitride.

In example embodiments, the third opening 485 may be formed to extend in the first direction, and a plurality of third openings 485 may be formed in the second direction. Thus, the upper electrode 490 may also extend in the first direction, and a plurality of upper electrodes 490 may be formed in the second direction to form an upper electrode column. Additionally, the bit line 500 may extend in the first direction, and a plurality of bit lines 500 may be formed in the second direction.

In example embodiments, the upper electrode 490 may be formed by forming a second conductive layer on the top surfaces of the phase change material layer patterns 470 and the fourth and the fifth insulation layer patterns 410 and 420 and the sixth insulation layer 480 to sufficiently fill the third opening 485, by planarizing the second conductive layer until a top surface of the sixth insulation layer 480 may be exposed, and by removing an upper portion of the planarized second conductive layer. Additionally, the bit line 500 may be formed by forming a third conductive layer on top surfaces of the upper electrodes 490 and the sixth insulation layer 480 and by planarizing the third conductive layer until the top surface of the sixth insulation layer 480 may be exposed.

The second conductive layer may be formed to include a metal, a metal nitride, a metal silicide, etc. The third conductive layer may be formed to include a low resistance metal, e.g., copper, aluminum, tungsten, etc.

In an example embodiment, the bit line 500 may be formed to include a barrier layer pattern (not shown) including a metal nitride.

In the method of manufacturing a phase change memory device, as the processes substantially the same as or similar to those illustrated with reference to FIGS. 1 to 25 are performed, the contact holes having a minute pitch like the first and the second contact holes 325 and 355 may be obtained with a desired arrangement.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:
1. A method of forming contact holes, the method comprising:
forming a first guide pattern over an etching target layer, the first guide pattern having a plurality of first openings each extending in a first direction and the first openings arranged in a second direction substantially perpendicular to the first direction;

forming a first block copolymer (BCP) structure in each of the first openings, the first BCP structure including, a plurality of first material layers arranged in the first direction at a first pitch in each of the first openings; and a plurality of second material layers filling a remaining portion of each of the first openings;

forming first holes by removing the first material layers;

forming a second guide pattern over the first guide pattern and the second material layers, the second guide pattern having a plurality of second openings, and each of the second openings extending in the first direction between the first openings in plan view;

forming a second block copolymer (BCP) structure in each of the second openings, the second BCP structure including, a plurality of third material layers arranged in the first direction at a second pitch in each of the second openings; and a plurality of fourth material layers filling a remaining portion of each of the second openings;

forming second holes by removing the third material layers; and removing portions of the etching target layer overlapped by the first holes or the second holes.

2. The method of claim 1, prior to the forming a first guide pattern over the etching target layer, further comprising:

forming a neutral layer over the etching target layer.

3. The method of claim 1, wherein the first openings are arranged in the second direction at equal distances from each other.

4. The method of claim 1, wherein the first pitch is about 20 nm to about 50 nm.

5. The method of claim 1, wherein, the first material layers include polymethyl methacrylate (PMMA), and the second material layers include polystyrene (PS).

6. The method of claim 1, wherein the forming a first block copolymer (BCP) structure comprises:

forming a first block copolymer (BCP) layer over the etching target layer and the first guide pattern, the first BCP layer substantially filling the first openings;

annealing the first BCP layer; and planarizing an upper portion of the annealed first BCP layer until a top surface of the first guide pattern is exposed.

7. The method of claim 1, wherein the forming first holes includes removing the first material layers by performing a dry etching process or a wet etching process.

8. The method of claim 1, prior to the forming a second guide pattern, further comprising:

forming an insulation layer pattern filling the first holes; and forming a second neutral layer over the second material layers and the insulation layer pattern.

9. The method of claim 1, wherein, the first and second openings extend in the first direction by substantially the same length as each other, and ends of the first openings are collinear with ends of the second openings, respectively.

10. The method of claim 1, wherein the first and second openings have substantially the same size as each other.

11. The method of claim 1, wherein, the first and third material layers have substantially the same material as each other, and the second and fourth material layers have substantially the same material as each other.

12. The method of claim 11, wherein the removing portions of the etching target layer overlapped by the first holes or the second holes comprises:

forming third holes by etching portions of the first guide pattern exposed by the second holes; and removing portions of the etching target layer exposed by the first holes or the third holes.

13. The method of claim 1, wherein the first and second pitches are substantially the same as each other.

14. The method of claim 13, wherein the first and second holes are collinear with each other in the second direction.

15. The method of claim 14, wherein the first and the second holes are arranged at a pitch substantially the same as the first and second pitches.

16. A method of forming contact holes, comprising:

forming first guide patterns over a target layer, the first guide patterns having a plurality of first openings and extending in a first direction;

forming first block copolymer (BCP) structure patterns between the first guide patterns by, providing first-type direct self-assembly polymer material layers each between second-type direct self-assembly polymer material layers, the first-type direct self-assembly polymer material layers arranged at a first pitch in the first direction;

forming first holes by removing the first-type direct self-assembly polymer material layers;

forming second guide patterns over remaining portions of the first block copolymer (BCP) structure patterns, the second guide patterns extending in the first direction and having a plurality of second openings over the first guide patterns;

forming second block copolymer (BCP) structure patterns between the second guide patterns by, providing third-type direct self-assembly polymer material layers each between fourth-type direct self-assembly polymer material layers, the third-type direct self-assembly polymer material layers arranged at a second pitch in the first direction;

forming second holes by removing the third-type direct self-assembly polymer material layers; and etching portions of the target layer overlapped by at least one of the first holes and the second holes to form the contact holes.

17. The method of claim 16, wherein the etching portions of the target layer results in the contact holes each having a shape other than a hexagonal shape.

18. The method of claim 16, wherein, the forming first BCP structure patterns includes substantially filling the first openings between the first guide patterns, and the forming second BCP structure patterns includes substantially filling the second openings between the second guide patterns.

19. The method of claim 18, wherein, the forming second guide patterns includes forming the second openings between the second guide patterns collinear with the first openings between the first guide patterns in a second direction, and the second direction is substantially perpendicular to the first direction.

20. The method of claim 16, wherein,
the first-type and third-type direct self-assembly polymer material layers are formed of a polymer selected from polymethyl methacrylate (PMMA) and polystyrene (PS),
the first-type direct self-assembly polymer material layers are formed of a different polymer than the second-type direct self-assembly polymer material layers, and
the third-type direct self-assembly polymer material layers are formed of a different polymer than the fourth-type direct self-assembly polymer material layers.

* * * * *